(12) United States Patent
Sato

(10) Patent No.: US 12,392,841 B2
(45) Date of Patent: Aug. 19, 2025

(54) INFORMATION PROCESSING DEVICE, INFORMATION PROCESSING METHOD, AND COMPUTER PROGRAM

(71) Applicant: GS Yuasa International Ltd., Kyoto (JP)

(72) Inventor: Katsuyuki Sato, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 263 days.

(21) Appl. No.: 18/027,497

(22) PCT Filed: Sep. 17, 2021

(86) PCT No.: PCT/JP2021/034264
§ 371 (c)(1),
(2) Date: Mar. 21, 2023

(87) PCT Pub. No.: WO2022/065221
PCT Pub. Date: Mar. 31, 2022

(65) Prior Publication Data
US 2023/0375633 A1 Nov. 23, 2023

(30) Foreign Application Priority Data

Sep. 23, 2020 (JP) .................................. 2020-158730

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/379* (2019.01); *G07C 5/10* (2013.01); *H02J 7/005* (2020.01)

(58) Field of Classification Search
CPC .. G01R 31/392; G01R 31/367; G01R 31/379; G01R 31/3842; G07C 5/10;
(Continued)

(56) References Cited

U.S. PATENT DOCUMENTS

2014/0089692 A1 3/2014 Hanafusa
2015/0323611 A1 11/2015 Kise et al.
(Continued)

FOREIGN PATENT DOCUMENTS

EP 3316387 A1 5/2018
EP 3611524 A1 2/2020
(Continued)

OTHER PUBLICATIONS

Song et al., "Lithium-Ion Battery Remaining Useful Life Prediction Based on GRU-RNN", 2018 12TH IEEE International Conference on Reliability, Maintainability, and Safety (ICRMS), 2018, pp. 317-322; Cited in European Search Report dated Mar. 4, 2024.
(Continued)

*Primary Examiner* — Michael J Zanelli
(74) *Attorney, Agent, or Firm* — RANKIN, HILL & CLARK LLP

(57) ABSTRACT

An information processing device includes: a first acquisition unit that acquires history data of a current, a voltage, and/or a temperature of a power storage device mounted on a vehicle; a second acquisition unit that acquires a use period until replacement of the power storage device and/or a cause of replacement; a deriving unit that derives determination data based on the history data; a setting unit that sets a degree of deterioration at a time of replacement of the power storage device based on the use period and/or the cause of replacement; and a determination unit that determines a degree of deterioration of the power storage device based on a relationship between determination data and the degree of
(Continued)

deterioration obtained by other power storage devices in advance, and the determination data of the power storage device to be determined, which is derived by the deriving unit.

13 Claims, 18 Drawing Sheets

(51) Int. Cl.
*G01R 31/379* (2019.01)
*G07C 5/10* (2006.01)
*H02J 7/00* (2006.01)

(58) Field of Classification Search
CPC .. H01M 10/425; H01M 10/482; H01M 10/48; H01M 10/42; H01M 2010/4271; H01M 2220/20; H02J 7/00034; H02J 7/0047; H02J 7/005; Y02E 60/10
See application file for complete search history.

(56) References Cited

U.S. PATENT DOCUMENTS

| | | | |
|---|---|---|---|
| 2016/0091573 A1* | 3/2016 | Shiraishi | G01R 31/389 324/426 |
| 2017/0205469 A1* | 7/2017 | Song | G01R 31/392 |
| 2017/0328957 A1* | 11/2017 | Suzuki | H01M 10/48 |
| 2019/0176639 A1 | 6/2019 | Kumar et al. | |
| 2020/0114775 A1 | 4/2020 | Tsurutani et al. | |
| 2020/0292620 A1 | 9/2020 | Takahashi et al. | |
| 2021/0033680 A1 | 2/2021 | Ukumori | |
| 2021/0374816 A1* | 12/2021 | Yamasaki | G01R 31/392 |

FOREIGN PATENT DOCUMENTS

| | | | | |
|---|---|---|---|---|
| JP | 04341769 A | * | 11/1992 | ......... G01R 31/3668 |
| JP | 2005-91624 A | | 4/2005 | |
| JP | 2013-253940 A | | 12/2013 | |
| JP | 2014-163875 A | | 9/2014 | |
| JP | 2018-179733 A | | 11/2018 | |
| JP | 2019-168453 A | | 10/2019 | |
| JP | 2020-61904 A | | 4/2020 | |
| JP | 2020-148560 A | | 9/2020 | |
| WO | 2013/140781 A1 | | 9/2013 | |
| WO | 2014/103705 A1 | | 7/2014 | |
| WO | 2016/208251 A1 | | 12/2016 | |

OTHER PUBLICATIONS

International Search Report (ISR) dated Nov. 9, 2021 filed in PCT/JP2021/034264.

* cited by examiner

INFORMATION PROCESSING DEVICE, INFORMATION PROCESSING METHOD, AND COMPUTER PROGRAM

TECHNICAL FIELD

The present invention relates to an information processing device, an information processing method, and a computer program for determining a degree of deterioration of a power storage device mounted on a vehicle.

BACKGROUND ART

For example, power storage devices such as lead-acid batteries are used in various applications in addition to in-vehicle applications and industrial applications. For example, an in-vehicle lead-acid battery is mounted on a moving body such as a vehicle such as an automobile, a motorcycle, a forklift, or a golf car, and is used as a power supply source to a starter motor at the time of starting an engine and a power supply source to various electrical components such as lights. For example, an industrial lead-acid battery is used as an emergency power supply or a power supply source to a UPS.

It is known that deterioration of lead-acid batteries progresses due to various factors. In order to prevent stop of supply of power due to unexpected loss of function of the lead-acid battery, it is necessary to appropriately determine the deterioration degree of the lead-acid battery and accurately determine the necessity of replacement.

The battery life diagnosis device of Patent Literature 1 predicts a life based on transition information of a deterioration index.

PRIOR ART DOCUMENT

Patent Document

Patent Document 1: JP-A-2018-179733

SUMMARY OF THE INVENTION

Problems to be Solved by the Invention

The life of a lead-acid battery mounted on a vehicle is predicted based on a general traveling style.

In general, when there is a trouble in the lead-acid battery, that is, when the SOH (State Of Health) of the lead-acid battery becomes 0 and the lead-acid battery reaches the end of life, the engine of the vehicle cannot be started on a road or the like, and thus the lead-acid battery is replaced. On the other hand, for example, even in a case where the usable period remains, that is, the SOH is not 0, based on the recommendation of the staff of the store due to a cause based on the traveling style such as the use period and the engine starting condition, the replacement may be performed according to the determination of the user. In the case of Patent Document 1, since the information when the lead-acid battery is replaced and the traveling style of the user are not taken into consideration, it is not possible to satisfactorily determine the degree of deterioration of each battery and predict the life.

An object of the present invention is to provide an information processing device, an information processing method, and a computer program capable of determining the degree of deterioration of a power storage device.

Means for Solving the Problems

An information processing device according to one aspect of the present invention includes: a first acquisition unit that acquires history data of at least one of a current, a voltage, or a temperature of a power storage device mounted on a vehicle; a second acquisition unit that acquires at least one of a use period until replacement of the power storage device or a cause of replacement; a deriving unit that derives determination data based on the history data acquired by the first acquisition unit; a setting unit that sets a degree of deterioration at the time of replacement of the power storage device based on at least one of the use period or the cause of replacement acquired by the second acquisition unit; and a determination unit that determines a degree of deterioration of the power storage device to be determined at the time of determination based on a relationship between determination data and a the degree of deterioration obtained by a plurality of other power storage devices in advance and the determination data of the power storage device to be determined, which is derived by the deriving unit.

An information processing method according to one aspect of the present invention includes: acquiring history data of at least one of a current, a voltage, or a temperature of a power storage device mounted on a vehicle; acquiring at least one of a use period until replacement of the power storage device or a cause of replacement; deriving determination data based on the acquired history data; setting a degree of deterioration of the power storage device based on at least one of the acquired use period or cause of replacement; and determining a degree of deterioration of the power storage device based on a relationship between determination data and a degree of deterioration obtained by a plurality of other power storage devices in advance and the determination data of the power storage device to be determined.

A computer program according to one aspect of the present invention causes a computer to execute the processing of: acquiring history data of at least one of a current, a voltage, or a temperature of a power storage device mounted on a vehicle; acquiring at least one of a use period until replacement of the power storage device or a cause of replacement; deriving determination data based on the acquired history data; setting a degree of deterioration of the power storage device based on at least one of the acquired use period or cause of replacement; and determining a degree of deterioration of the power storage device based on a relationship between determination data and a degree of deterioration obtained by a plurality of other power storage devices in advance and the determination data of the power storage device to be determined.

Advantages of the Invention

According to the present invention, it is possible to determine deterioration of a power storage device.

MODE FOR CARRYING OUT THE INVENTION

Outline of Embodiment

Figure 1:
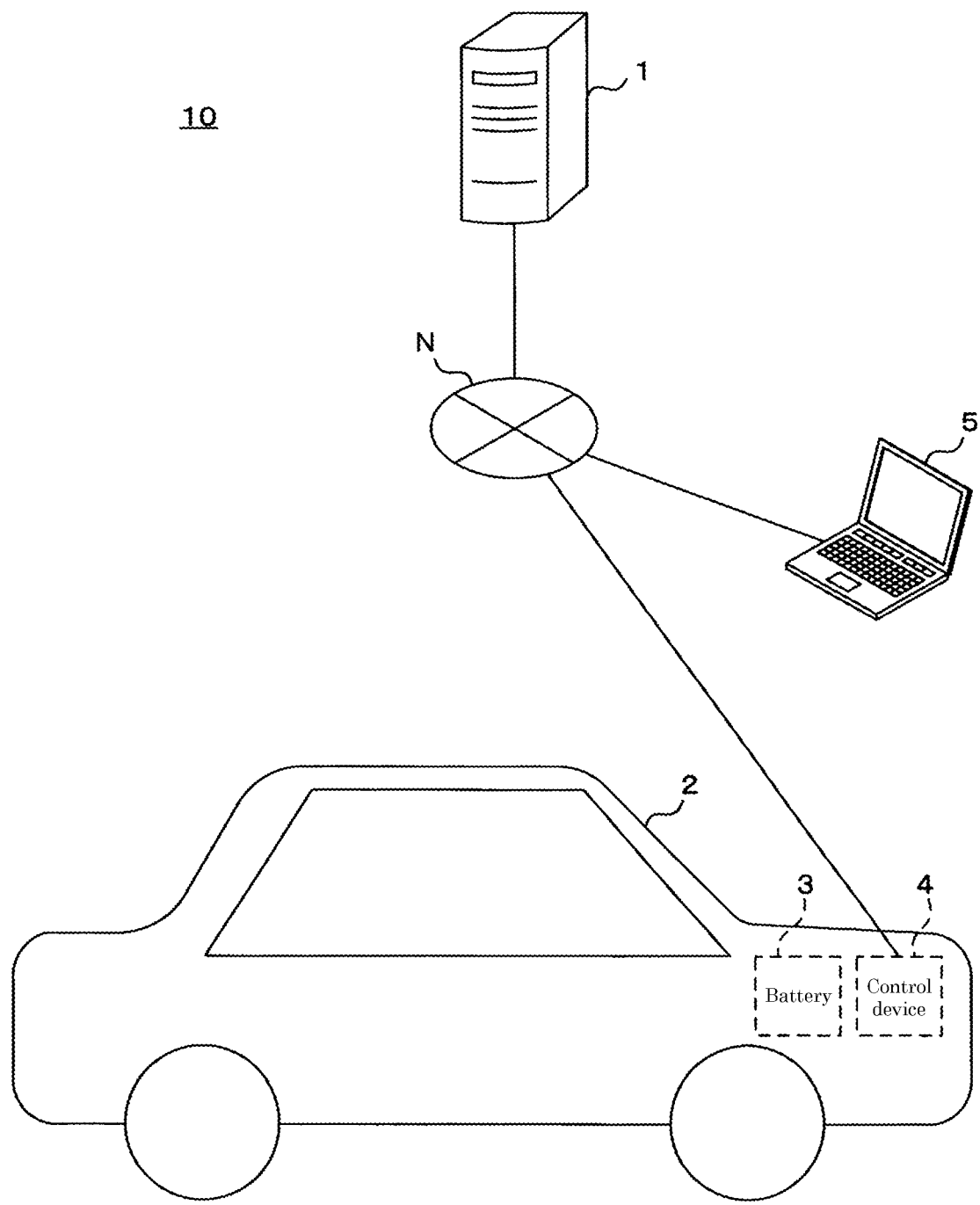
FIG. 1 is a schematic diagram illustrating an example of a configuration of an information processing system according to a first embodiment.

An information processing device according to an embodiment includes: a first acquisition unit that acquires history data of at least one of a current, a voltage, or a temperature of a power storage device mounted on a vehicle; a second acquisition unit that acquires at least one of a use period until replacement of the power storage device or a cause of replacement; a deriving unit that derives determination data based on the history data acquired by the first acquisition unit; a setting unit that sets a degree of deterioration at the time of replacement of the power storage device based on at least one of the use period or the cause of replacement acquired by the second acquisition unit; and a determination unit that determines a degree of deterioration of the power storage device to be determined at the time of determination based on a relationship between determination data and a degree of deterioration obtained by a plurality of other power storage devices in advance, and the determination data of the power storage device to be determined, which is derived by the deriving unit.

According to the above configuration, the degree of deterioration of the power storage device is determined based on the determination data of the power storage device to be determined with reference to the relationship between the determination data and the degree of deterioration derived based on the data in which the determination data is associated with the degree of deterioration set based on the use period and the cause of replacement. The relationship uses the degree of deterioration derived based on the use period, the cause of replacement, and the like of the plurality of power storage devices replaced before the degree of deterioration is determined. Therefore, the degree of deterioration can be determined satisfactorily based on the determination data of the target power storage device, and the life can be estimated.

In the above-described information processing device, the determination unit may input the determination data of the power storage device to be determined, which is derived by the deriving unit, to a learning model that outputs a degree of deterioration when the determination data is input, and determine a degree of deterioration.

According to the above configuration, the degree of deterioration can be easily and accurately acquired.

In the above-described information processing device, the second acquisition unit may further acquire an actually measured degree of deterioration of the power storage device at the time of replacement, and the setting unit may correct the degree of deterioration on a basis of the actually measured degree of deterioration acquired by the second acquisition unit.

According to the above configuration, the accuracy of the relationship between the determination data and the degree of deterioration becomes more favorable, and the degree of deterioration of the target power storage device can be more favorably determined.

The above-described information processing device may further include: a second setting unit that sets a remaining life of the power storage device based on at least one of the use period or the cause of replacement acquired by the second acquisition unit; and an estimation unit that estimates a remaining life based on a relationship between a degree of deterioration and the remaining life, and the degree of deterioration of the power storage device to be determined, which is determined by the determination unit.

According to the above configuration, the remaining life can be satisfactorily estimated based on the degree of deterioration.

In the above-described information processing device, the estimation unit may input the degree of deterioration of the power storage device determined by the determination unit to a second learning model that outputs a remaining life when a degree of deterioration is input, and estimate the remaining life.

According to the above configuration, the remaining life can be easily and accurately acquired.

An information processing device according to an embodiment may include: a first acquisition unit that acquires history data of at least one of a current, a voltage, or a temperature of a power storage device mounted on a vehicle; a second acquisition unit that acquires at least one of a use period until replacement of the power storage device or a cause of replacement; a deriving unit that derives determination data based on the history data acquired by the first acquisition unit; a setting unit that sets a remaining life of the power storage device based on at least one of the use period or the cause of replacement acquired by the second acquisition unit; and an estimation unit that estimates a remaining life of the power storage device based on a relationship between determination data and a remaining life obtained by a plurality of other power storage devices in advance, and the determination data of the power storage device to be determined, which is derived by the deriving unit.

According to the above configuration, the remaining life of the power storage device is determined based on the determination data of the power storage device to be determined with reference to the relationship between the determination data and the remaining life derived based on the data in which the determination data is associated with the remaining life set based on the use period until replacement, the cause of replacement, and the like. The relationship uses the remaining life derived based on the use period, the cause of replacement, and the like of the plurality of power storage devices replaced before the remaining life is determined. Therefore, the life can be satisfactorily estimated based on the determination data of the target power storage device.

In the above-described information processing device, the estimation unit may input the determination data of the power storage device to be determined, which is derived by the deriving unit, to a learning model that outputs a remaining life when the determination data is input, and estimate a remaining life.

According to the above configuration, the remaining life can be easily and accurately acquired.

In the above-described information processing device, the remaining life may represent an expected transition of a degree of deterioration after a time point at which determination data is derived. In addition, in the prediction, a life change when the use condition is changed may be represented.

According to the above configuration, it is possible to extend the life of the power storage device due to the change in the use condition and to predict the arrival of the early end of life due to the change in the use condition.

In the above-described information processing device, the setting unit may set a degree of deterioration or a remaining life according to whether the cause of replacement is a trouble of the power storage device or a cause before occurrence of the trouble.

When replacement is performed at the recommendation of the staff of the store before occurrence of trouble, a usable period may remain. According to the above configuration, the degree of deterioration or the remaining life can be favorably set according to whether the cause of replacement is a trouble of the power storage device or a cause before occurrence of the trouble.

The above-described information processing device may further include: a third acquisition unit that acquires a degree of deterioration determined by the determination unit or a remaining life estimated by the estimation unit immediately before replacement when the second acquisition unit acquires at least one of the use period or the cause of replacement; a fourth acquisition unit that acquires a degree of deterioration or a remaining life set by the setting unit based on at least one of the use period or the cause of replacement; and a correction unit that corrects a relationship between the determination data and the degree of deterioration or a relationship between the determination data and the remaining life based on the determination data at the time of determination by the determination unit or at the time of estimation by the estimation unit and the degree of deterioration or the remaining life acquired by the fourth acquisition unit.

According to the above configuration, when the power storage device is replaced, the relationship between the determination data and the degree of deterioration or the relationship between the determination data and the remaining life is corrected based on the degree of deterioration determined or the estimated remaining life immediately before replacement, and the degree of deterioration or the remaining life set based on the cause of replacement. The accuracy of the degree of deterioration to be determined next time or the remaining life to be estimated is improved.

An information processing method according to an embodiment includes: acquiring history data of at least one of a current, a voltage, or a temperature of a power storage device mounted on a vehicle; acquiring at least one of a use period until replacement of the power storage device or a cause of replacement; deriving determination data based on the acquired history data; setting a degree of deterioration of the power storage device based on at least one of the acquired use period or cause of replacement; and determining a degree of deterioration of the power storage device based on a relationship between determination data and a degree of deterioration obtained by a plurality of other power storage devices in advance, and the determination data of the power storage device to be determined.

According to the above configuration, the degree of deterioration of the power storage device is determined based on the determination data of the power storage device to be determined with reference to the relationship between the determination data and the degree of deterioration derived based on the data in which the determination data is associated with the degree of deterioration set based on the use period, the cause of replacement, and the like. Since the degree of deterioration derived based on the use period, the cause of replacement, and the like of the plurality of power storage devices replaced before the degree of deterioration is determined is used, it is possible to satisfactorily determine the degree of deterioration and estimate the life.

In the above-described information processing method, a degree of deterioration determined immediately before replacement may be acquired when at least one of the use period or the cause of replacement is acquired, a degree of deterioration to be set may be acquired based on at least one of the use period or the cause of replacement, and the relationship between the determination data and the degree of deterioration may be corrected based on the determination data at the time of determination and the degree of deterioration to be set.

According to the above configuration, since the relationship between the determination data and the degree of deterioration or the relationship between the determination data and the remaining life is corrected, the accuracy of the degree of deterioration to be determined next time or the remaining life to be estimated is improved.

A computer program according to an embodiment causes a computer to execute the processing of: acquiring history data of at least one of a current, a voltage, or a temperature of a power storage device mounted on a vehicle; acquiring at least one of a use period until replacement of the power storage device or a cause of replacement; deriving determination data based on the acquired history data; setting a degree of deterioration of the power storage device based on at least one of the acquired use period or cause of replacement; and determining a degree of deterioration of the power storage device based on a relationship between determination data and a degree of deterioration obtained by a plurality of other power storage devices in advance, and the determination data of the power storage device to be determined.

According to the above configuration, the degree of deterioration can be determined satisfactorily based on the determination data of the power storage device to be determined with reference to the relationship between the determination data and the degree of deterioration acquired in advance from the plurality of power storage devices replaced before the degree of deterioration of the power storage device to be determined is determined, and the life can be estimated.

The computer program described above may causes a computer to execute the processing of; acquiring a degree of deterioration determined immediately before replacement when at least one of the use period or the cause of replacement is acquired; acquiring a degree of deterioration to be set based on at least one of the use period or the cause of replacement; and correcting the relationship between the determination data and the degree of deterioration based on the determination data at the time of determination and the degree of deterioration to be set.

According to the above configuration, since the relationship between the determination data and the degree of deterioration or the relationship between the determination data and the remaining life is corrected, the accuracy of the degree of deterioration to be determined next time or the remaining life to be estimated is improved.

First Embodiment

FIG. 1 is a schematic diagram illustrating an example of a configuration of an information processing system 10 according to a first embodiment. In the information processing system 10, an information processing device 1, a control device 4 that controls charge-discharge of a lead-acid battery (hereinafter, referred to as a battery) 3 as a power storage device mounted on a vehicle 2, and a terminal 5 of a store of the battery 3 are connected via a network N such as the Internet.

The information processing device 1 acquires time series (history) data of currents, voltages, and temperatures of the plurality of batteries 3 from the control device 4, acquires replacement information such as a use period and a replacement cause of the batteries 3 of the plurality of vehicles 2 from the terminal 5, and derives determination data based on the acquired history data. The information processing device 1 sets the degree of deterioration of the lead-acid battery based on the acquired use period and replacement cause, and derives a relationship (estimation model) between the determination data and the degree of deterioration based on data in which the determination data and the degree of deterioration are associated with each other. The information processing device 1 derives determination data of the battery 3 to be determined, determines the degree of deterioration of the battery 3 based on the relationship, and transmits a determination result to the terminal 5.

Figure 2:
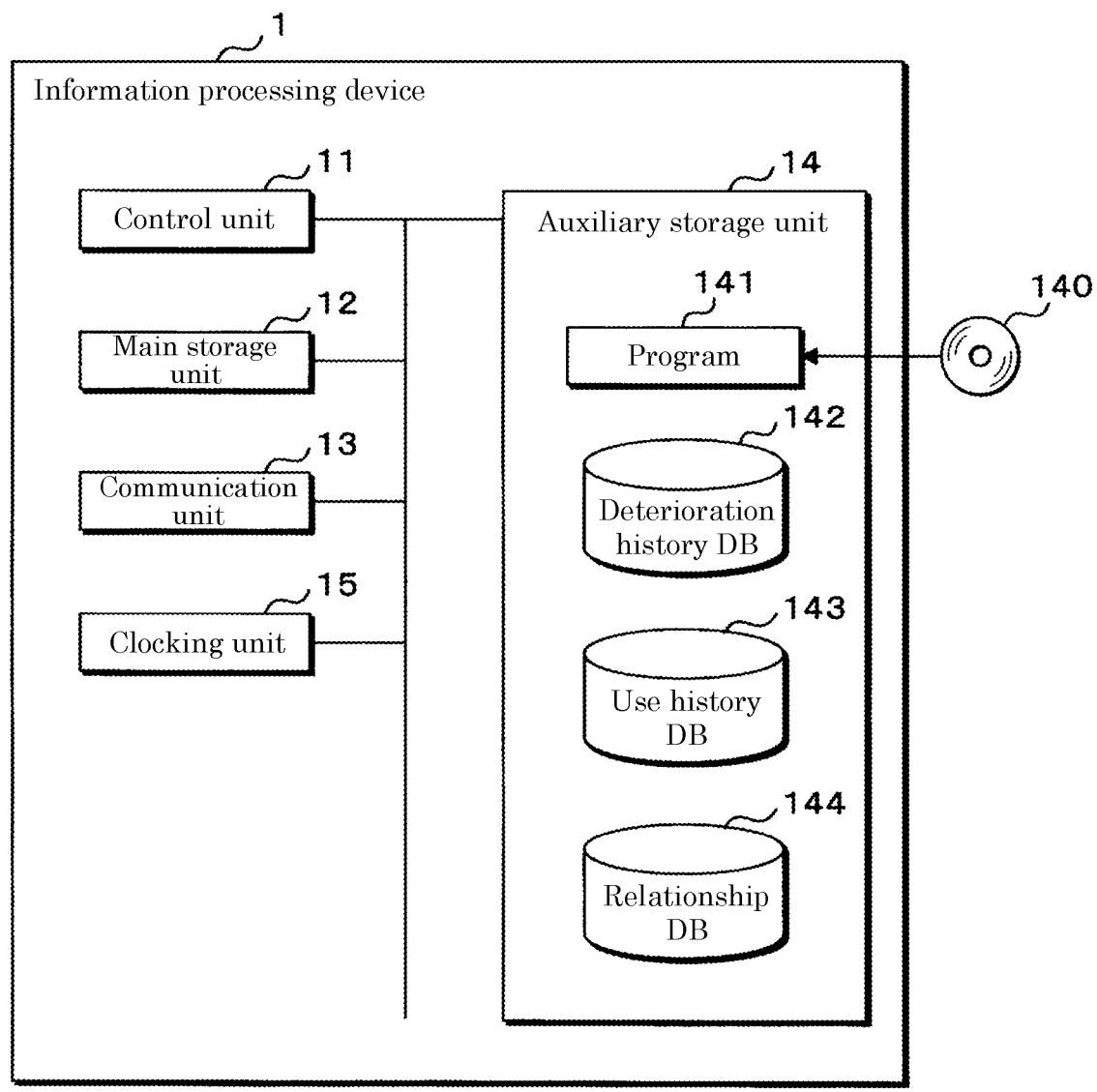
FIG. 2 is a block diagram illustrating an example of a configuration of an information processing device.

FIG. 2 is a block diagram illustrating an example of a configuration of the information processing device 1. The information processing device 1 includes a control unit 11 that controls the entire device, a main storage unit 12, a communication unit 13, an auxiliary storage unit 14, and a clocking unit 15. The information processing device 1 can include one or a plurality of servers. The information processing device 1 may use a virtual machine in addition to a plurality of information processing devices performing distributed processing.

The control unit 11 can include a central processing unit (CPU), a read only memory (ROM), a random access memory (RAM), and the like.

The control unit 11 may include a graphics processing unit (GPU). In addition, a quantum computer may be used.

The main storage unit 12 is a temporary storage area such as a static random access memory (SRAM), a dynamic random access memory (DRAM), or a flash memory, and temporarily stores data necessary for the control unit 11 to execute calculation processing.

The communication unit 13 has a function of communicating with the terminal 5 and the control device 4 via the network N, and can transmit and receive necessary information. Specifically, the communication unit 13 receives the replacement information transmitted by the terminal 5, and receives the history data of the current, the voltage, and the temperature transmitted by the control device 4. The communication unit 13 transmits the determination result of the deterioration of the battery 3 to the terminal 5.

The auxiliary storage unit 14 is a large-capacity memory, a hard disk, or the like, and stores a program necessary for the control unit 11 to execute processing, a program 141 for performing deterioration determination processing to be described later, a deterioration history DB 142, a use history DB 143, and a relationship DB 144. The deterioration history DB 142 may be stored in another DB server.

The program 141 stored in the auxiliary storage unit 14 may be provided by a recording medium 140 in which the program 141 is recorded in a readable manner. The recording medium 140 is, for example, a portable memory such as a USB memory, an SD card, a micro SD card, or a CompactFlash (registered trademark). The program 141 recorded in the recording medium 140 is read from the recording medium 140 using a reading device (not illustrated) and installed in the auxiliary storage unit 14. Furthermore, the program 141 may be provided by communication via the communication unit 13.

The clocking unit 15 performs clocking.

Figure 3:
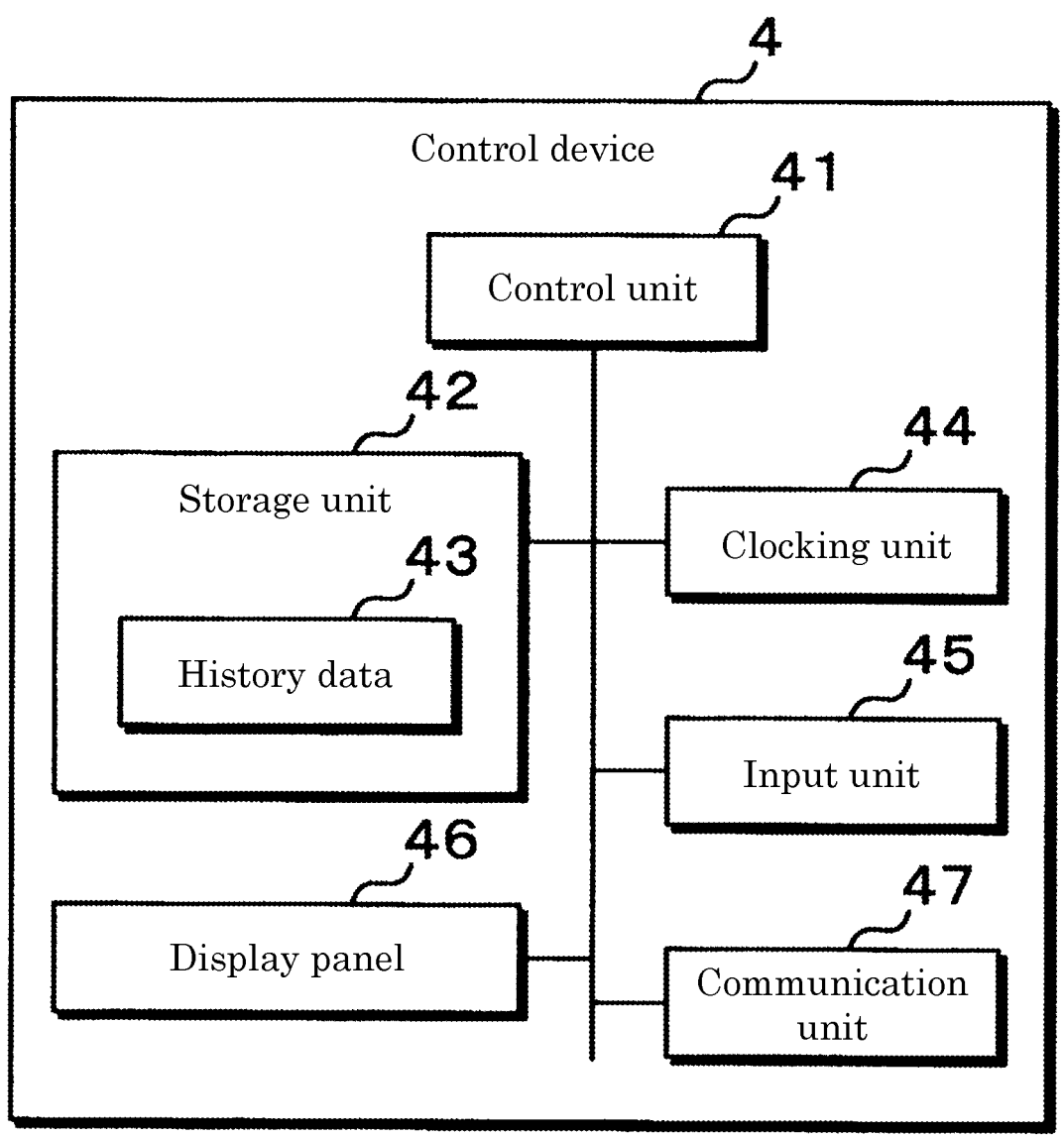
FIG. 3 is a block diagram illustrating an example of a configuration of a control device.

FIG. 3 is a block diagram illustrating an example of a configuration of the control device 4.

The control device 4 includes a control unit 41, a storage unit 42, a clocking unit 44, an input unit 45, a display panel 46, and a communication unit 47.

The control unit 41, the clocking unit 44, and the communication unit 47 have configurations similar to those of the control unit 11, the clocking unit 15, and the communication unit 13.

The storage unit 42 stores various programs and data. The storage unit 42 stores charge-discharge and temperature history data 43. The charge-discharge history is an operation history of the battery 3, and is information including information indicating a period (use period) during which the battery 3 performs charge or discharge, information on charge or discharge performed by the battery 3 during the use period, and the like. The information indicating the use period of the battery 3 is information including information indicating start and end points of charge or discharge, an accumulated use period in which the battery 3 is used, and the like. The information on charge or discharge performed by the battery 3 is information indicating a voltage, a rate, an integrated value of a current, and the like at the time of charge or discharge performed by the battery 3. The temperature history is an integrated value of the temperature of the battery 3.

The input unit 45 receives inputs of detection results from a voltage sensor and a current sensor (not illustrated).

The display panel 46 can be configured by a liquid crystal panel, an organic electro luminescence (EL) display panel, or the like.

The communication unit 47 has a function of communicating with the terminal 5 and the control device 4 via the network N, and can transmit and receive necessary information.

Figure 4:
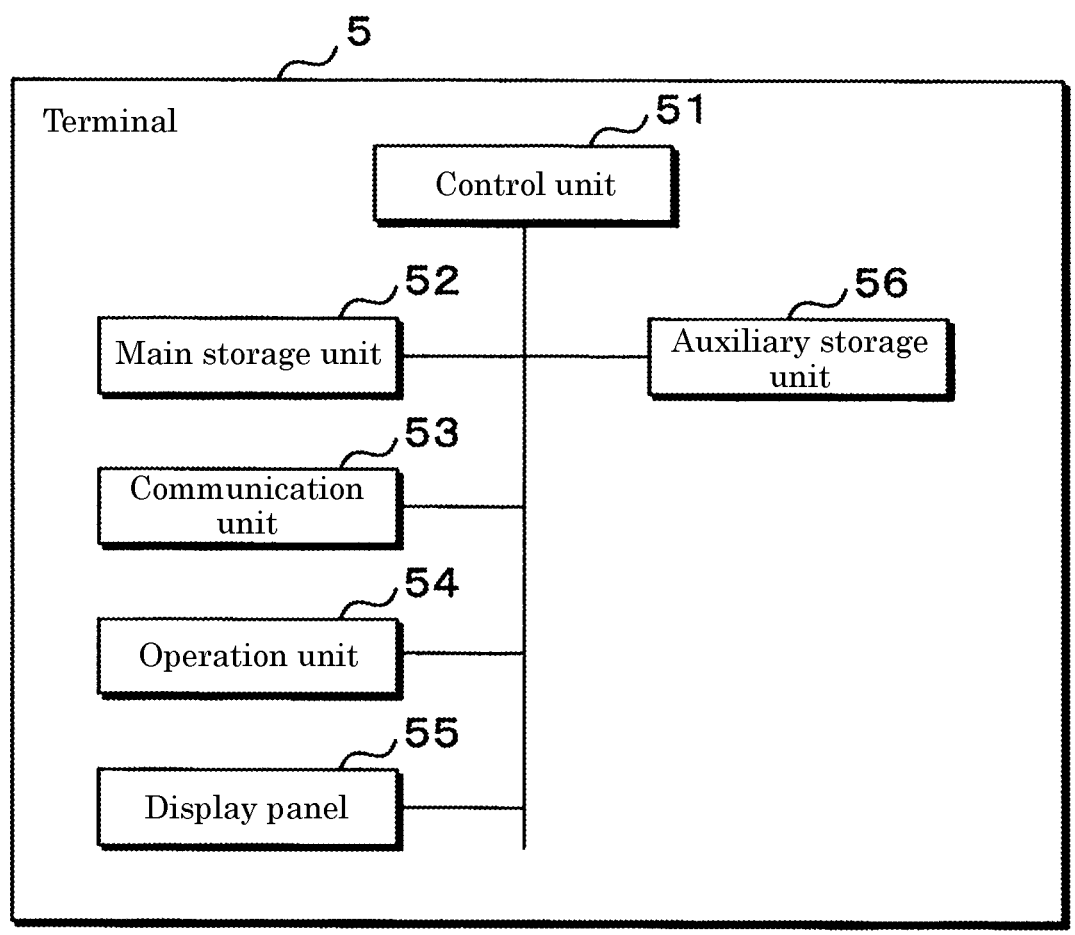
FIG. 4 is a block diagram illustrating an example of a configuration of a terminal.

FIG. 4 is a block diagram illustrating an example of a configuration of the terminal 5.

The terminal 5 includes a control unit 51 that controls the entire device, a main storage unit 52, a communication unit 53, an operation unit 54, a display panel 55, and an auxiliary storage unit 56. The terminal 5 can be configured by, for example, a personal computer, a tablet, a smartphone, or the like. The control unit 51 can include a CPU, a ROM, a RAM, and the like. The control unit 51 may include a GPU.

The main storage unit 52 is a temporary storage area such as an SRAM, a DRAM, or a flash memory, and temporarily stores data necessary for the control unit 51 to execute calculation processing.

The communication unit 53 has a function of communicating with the information processing device 1 via the network N, and transmits and receives necessary information.

The operation unit 54 includes, for example, a hardware keyboard, a mouse, a touch panel, and the like, and can perform operation of icons and the like displayed on the display panel 55, input of characters and the like, and the like.

The display panel 55 can be configured by a liquid crystal panel, an organic electro luminescence (EL) display panel, or the like. The control unit 51 performs control for displaying necessary information on the display panel 55. The control unit 51 displays, on the display panel 55, information such as a determination result of deterioration of the battery 3 and an instruction of replacement acquired from the information processing device 1.

The auxiliary storage unit 56 is a large-capacity memory.

Table 1 shows an example of a table stored in the deterioration history DB 142.

TABLE 1

| No. | History Data | Determination Data | Replacement Information | | SOH(%) | | Remaining Life Rate (%) | |
| | | | Use Period (Year) | Replacement Cause | Set Value | Actual Measurement Value | Set Value | Actual Measurement Value |
| --- | --- | --- | --- | --- | --- | --- | --- | --- |
| 1 | | | 0 | 0 | 100 | | 100 | |
| 2 | | | 2.2 | 4 | 15 | 14 | 13 | 12 |
| 3 | | | 2.5 | 5 | 10 | 11 | 9 | 10 |
| 4 | | | 3 | 6 | 0 | | 0 | |
| ... | ... | ... | ... | ... | ... | ... | ... | ... |

The deterioration history DB 142 stores a No. column, a history data column, a determination data column, a replacement information column including a use period column and a replacement cause column, an SOH column including a set value column and an actual measurement value column, and a remaining life rate column including a set value column and an actual measurement value column. Here, the SOH is "Ratio of Voltage during Normal Temperature High Rate Discharge at time of Estimation to Voltage during Normal Temperature High Rate Discharge at Reference Time". The SOH may be a capacity retention ratio. The remaining life rate is "Ratio of Usable Period Remaining at time of Determination to Usable Period".

The No. column stores the row No. when the SOH and the remaining life rate of the battery 3 are set for a plurality of different batteries 3 and at different timings of the same battery 3.

The history data column stores time-series data of the current, the voltage, and the temperature of the battery 3. Examples of the time-series data of the current or the temperature include an integrated value of the current or the temperature.

The determination data column stores an integrated value of a current or a temperature, a time differential value of a voltage or an internal resistance derived from the history data, or a combination thereof. The use period column stores a use period after mounting or replacement of the battery 3.

For example, the replacement cause column stores the replacement cause as a numerical value from 0 to 6.

0 At time of start of use (no need to replace)

1 Replacement due to long-term use (no sign of failure)

2 Idling stop control is no longer performed

3 Case where dealer recommends replacement of battery 3 due to turbidity of electrolyte solution 4 Case where voltage measured by dealer is less than or equal to threshold 5 It is difficult for engine to start 6 Engine is no longer running As shown in Table 2 below, the control unit 11 stores an SOH setting table indicating a correspondence relationship between the replacement cause and the set value of the SOH in the relationship DB 144.

When the replacement information is acquired, the control unit 11 refers to the SOH setting table, sets the SOH based on the replacement information, and stores the set value in the set value column of the SOH of the deterioration history DB 142.

TABLE 2

| Replacement Cause | Set Value of SOH (%) |
| --- | --- |
| At Time of Start of Use | 100 |
| 1 | 30 |

TABLE 2-continued

| Replacement Cause | Set Value of SOH (%) |
| --- | --- |
| 2 | 25 |
| 3 | 20 |
| 4 | 15 |
| 5 | 10 |
| 6 | 0 |

The control unit 11 stores an actual measurement value when the SOH is actually measured in the actual measurement value column.

The control unit 11 updates the set value for the corresponding replacement cause in the SOH setting table based on the actually measured SOH. As a result, the set value of the SOH set when the replacement information is acquired is corrected.

The control unit 11 stores a remaining life rate setting table indicating a correspondence relationship between the replacement cause and the remaining life rate in the relationship DB 144 as shown in Table 3 below.

When the replacement information is acquired, the control unit 11 refers to the remaining life rate setting table, sets the remaining life rate based on the replacement information, and stores the set value in the set value column of the remaining life rate of the deterioration history DB 142.

TABLE 3

| Replacement Cause | Remaining Life Rate (%) |
|---|---|
| At Time of Start of Use | 100 |
| 1 | 27 |
| 2 | 23 |
| 3 | 18 |
| 4 | 13 |
| 5 | 9 |
| 6 | 0 |

The control unit 11 stores the remaining life rate when the remaining usable period is actually measured in the actual measurement value column.

The control unit 11 updates the set value for the corresponding replacement cause in the remaining life rate setting table based on the actually measured remaining life rate.

The control unit 11 derives a first relationship between the determination data and the SOH based on the determination data and the corresponding SOH stored in the deterioration history DB 142.

The control unit 11 derives a second relationship between the determination data and the remaining life rate based on the determination data and the corresponding remaining life rate stored in the deterioration history DB 142. The control unit 11 may derive a third relationship between the SOH and the remaining life rate.

The control unit 11 stores the first relationship, the second relationship, or the third relationship in the relationship DB 144. The first relationship, the second relationship, or the third relationship may be a function.

Table 4 shows an example of a table stored in the use history DB 143.

TABLE 4

| IDNo. 1 No. | History Data | Determination Data | SOH(%) | | Remaining Life Rate (%) | |
|---|---|---|---|---|---|---|
| | | | Determination Value | Actual Measurement Value | Determination Value | Actual Measurement Value |
| 1 | | | 100 | | 100 | |
| 2 | | | 50 | 45 | 45 | 42 |
| ... | ... | ... | ... | ... | ... | ... |
| 6 | | | 15 | | 13 | |
| 7 | | | 0 | | 0 | |

The use history DB 143 stores, for each battery 3, a No. column, a history data column, a determination data column, an SOH column of a determination value column and an actual measurement value column, and a remaining life rate column of an estimated value column and an actual measurement value column. Table 4 shows a use history of the battery 3 of ID No. 1. The history data column, the determination data column, the actual measurement value column of the SOH, and the actual measurement value column of the remaining life rate store the same contents as the history data column, the determination data column, the actual measurement value column of the SOH, and the actual measurement value column of the remaining life rate in the deterioration history DB 142.

The determination value column of the SOH stores values determined as described later.

The estimated value column of the remaining life rate stores values estimated as described later.

Hereinafter, a method for deriving the first relationship and the second relationship will be described.

Figure 5:
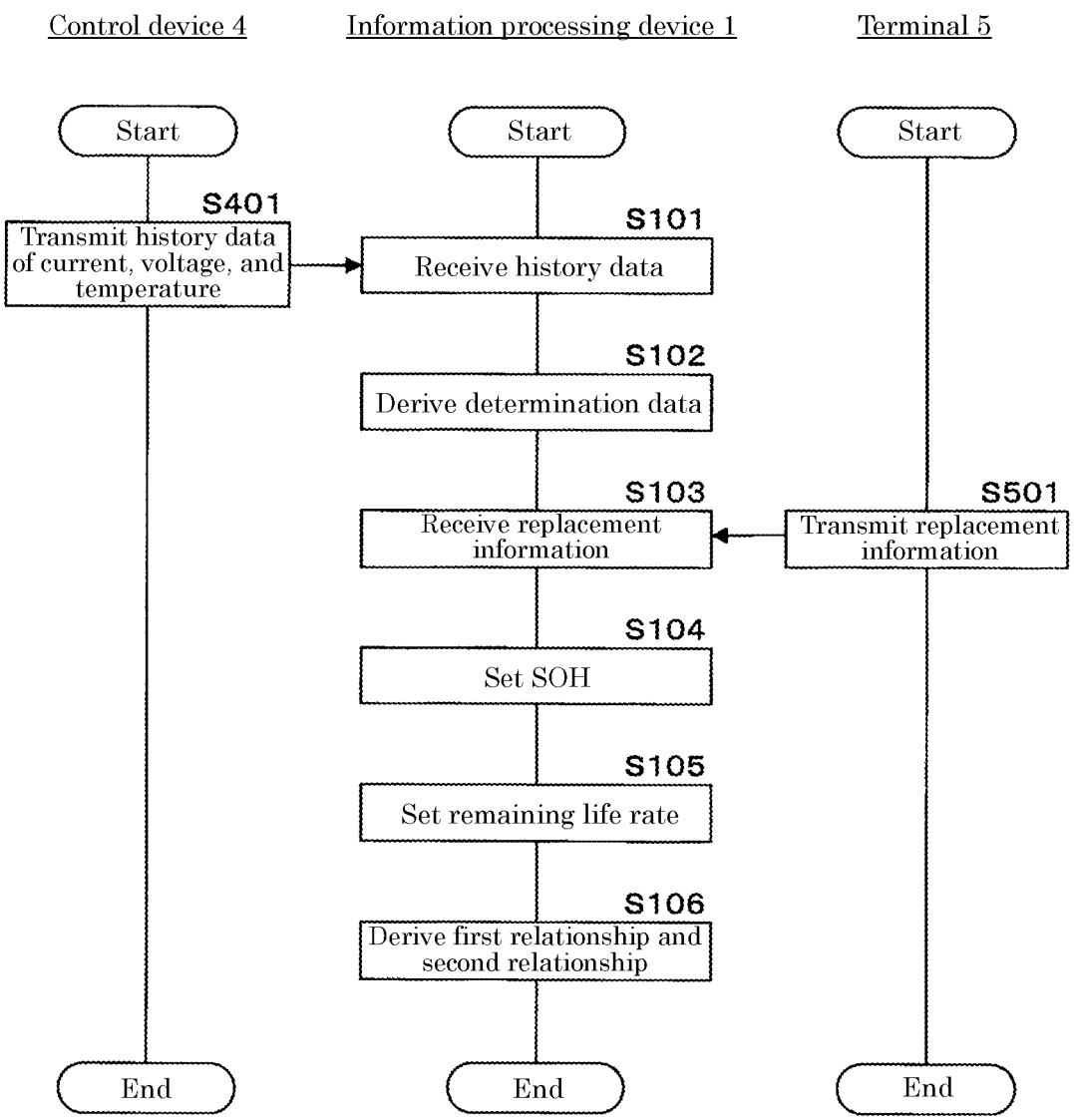
FIG. 5 is a flowchart illustrating a procedure of processing of deriving a first relationship and a second relationship by a control unit.

FIG. 5 is a flowchart illustrating a procedure of processing of deriving the first relationship and the second relationship by the control unit 11.

The control unit 41 transmits the history data of the current, the voltage, and the temperature (S401).

The control unit 11 receives the history data of the current, the voltage, and the temperature, and stores the history data in the deterioration history DB 142 (S101).

The control unit 11 derives determination data and stores the determination data in the deterioration history DB 142 (S102).

The control unit 51 transmits the replacement information (S501).

The control unit 11 receives the replacement information and stores the replacement information in the deterioration history DB 142 (S103).

The control unit 11 refers to the SOH setting table, sets the SOH based on the replacement information, and stores the SOH in the set value column of the SOH of the deterioration history DB 142 (S104).

The control unit 11 refers to the remaining life rate setting table, sets the remaining life rate based on the replacement information, and stores the remaining life rate in the set value column of the remaining life rate of the deterioration history DB 142 (S105).

The control unit 11 derives the first relationship between the SOH and the determination data and the second relationship between the remaining life and the determination data from the deterioration history DB 142, stores the first relationship and the second relationship in the relationship DB 144 (S106), and ends the processing. The control unit 11 may derive the third relationship.

Hereinafter, a method for determining the SOH and a method for estimating the remaining life rate will be described.

Figure 6:
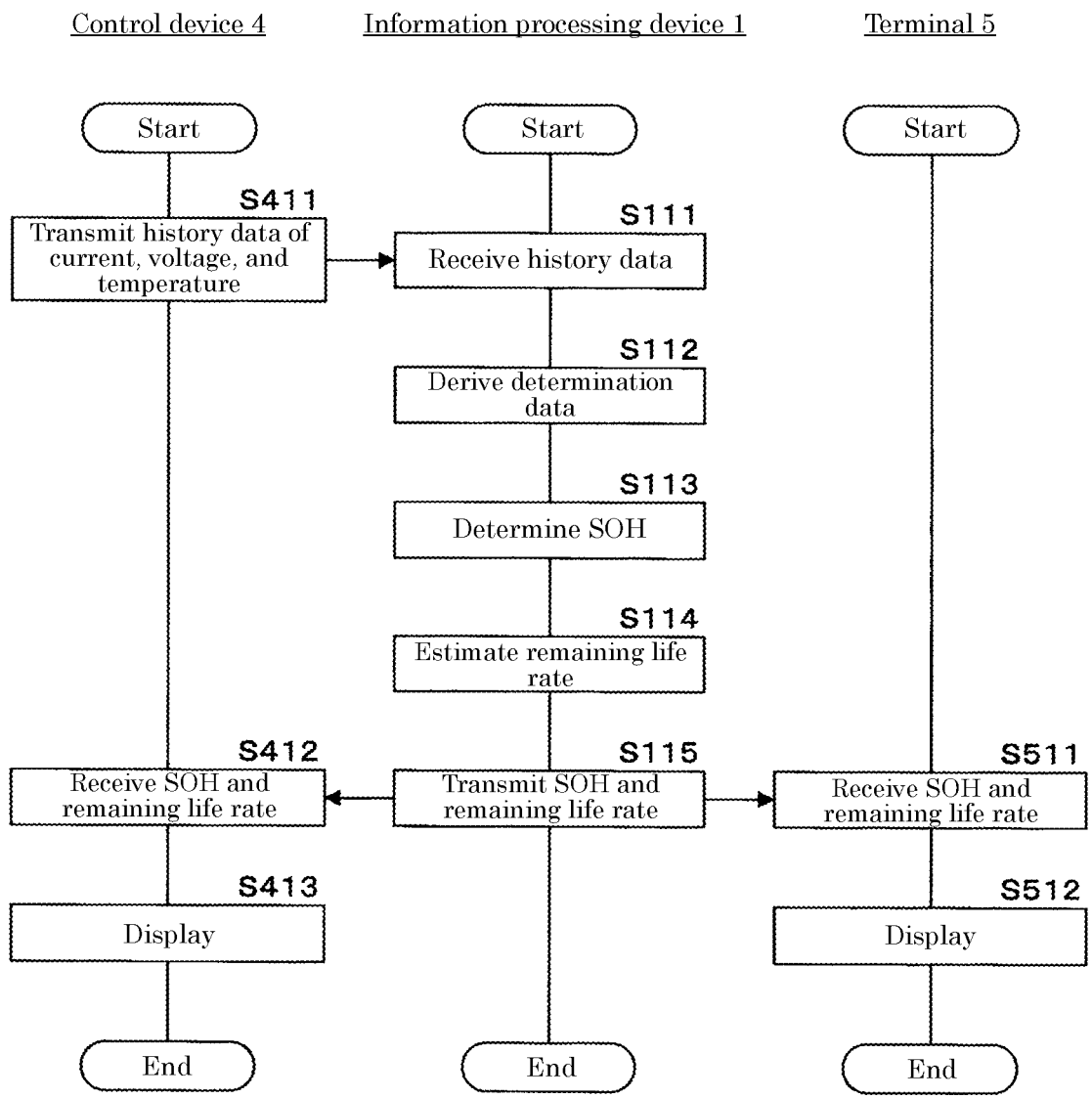
FIG. 6 is a flowchart illustrating a procedure of processing of determining an SOH and estimating a remaining life rate by the control unit 11.

FIG. 6 is a flowchart illustrating a procedure of processing of determining the SOH and estimating the remaining life rate by the control unit 11.

The control unit 41 transmits the history data of the current, the voltage, and the temperature (S411).

The control unit 11 receives the history data and stores the history data in the use history DB 143 (S111).

The control unit 11 derives determination data and stores the determination data in the use history DB 143 (S112).

The control unit 11 reads the first relationship from the relationship DB 144, determines the SOH based on the derived determination data and the first relationship, and stores the SOH in the use history DB 143 (S113).

The control unit 11 reads the second relationship from the relationship DB 144, estimates the remaining life rate based on the derived determination data and the second relationship, and stores the remaining life rate in the use history DB 143 (S114).

The control unit 11 may read the third relationship from the relationship DB 144 and estimate the remaining life rate based on the determined SOH and the third relationship.

The control unit 11 transmits the SOH and the remaining life rate to the control device 4 and the terminal 5 (S115), and ends the processing.

The control unit 41 receives the SOH and the remaining life rate (S511), displays the SOH and the remaining life rate on the display panel 46 (S512), and ends the processing.

The control unit 51 receives the SOH and the remaining life rate (S412), displays the SOH and the remaining life rate on the display panel 55 (S413), and ends the processing.

Figure 7:
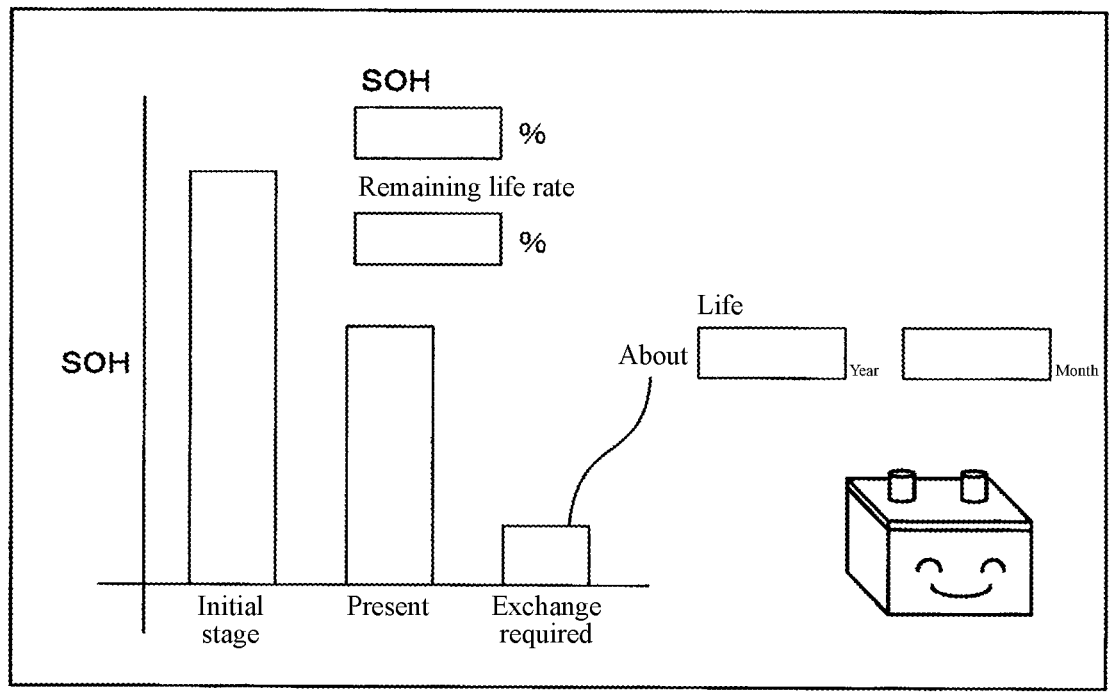
FIG. 7 is an explanatory diagram illustrating a display screen displayed on a display panel.

FIG. 7 is an explanatory diagram illustrating "an example of" a display screen displayed on the display panel 46 or the display panel 55.

The control unit 41 or 51 displays the SOH determined by the control unit 11 and the estimated remaining life rate in the upper part of the display screen. The control unit 41 or 51 displays the estimated date of life expiration as the life on the right side of the display of the remaining life rate. The life is calculated by multiplying the usable period by the remaining life rate. The control unit 41 or 51 displays a graph indicating the current determination SOH in a lower left part of the display screen.

Hereinafter, a method for correcting the first relationship based on the SOH determined immediately before replacement and the SOH obtained based on the replacement cause with reference to the SOH setting table when the battery 3 is replaced will be described.

Figure 8:
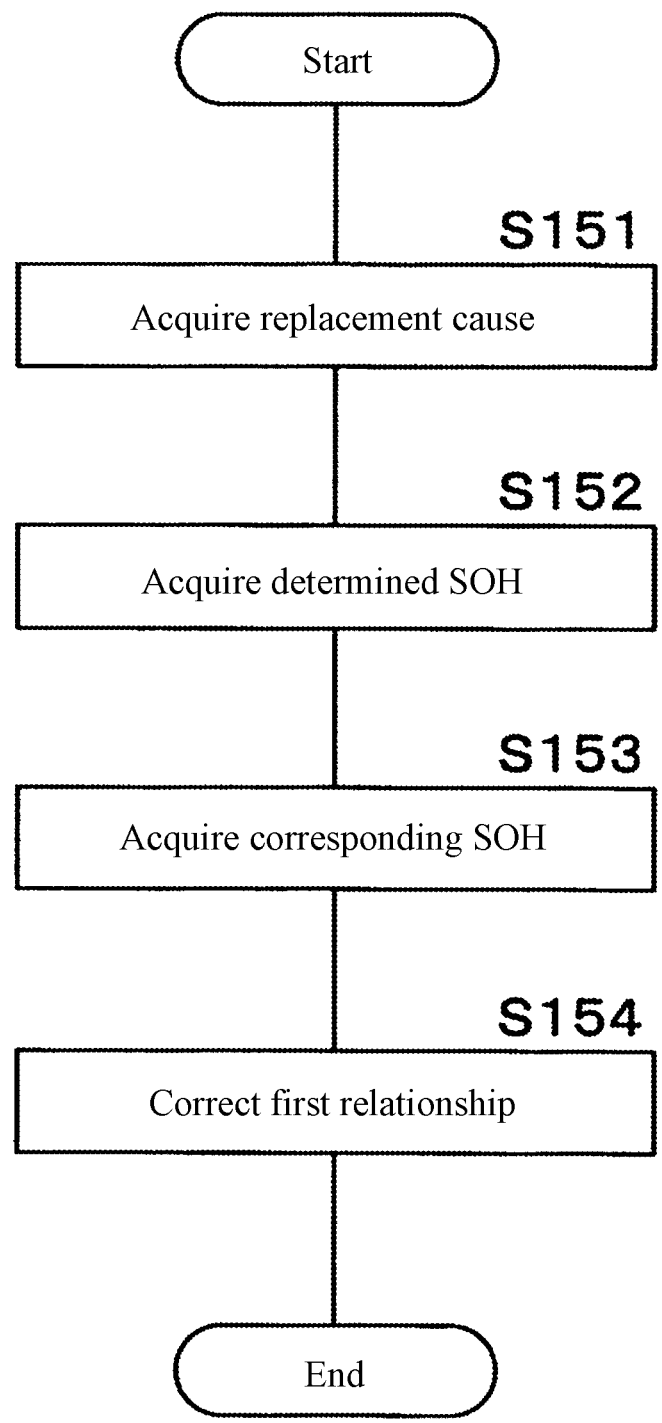
FIG. 8 is a flowchart illustrating a procedure of processing of correcting the first relationship by the control unit.

FIG. 8 is a flowchart illustrating a procedure of processing of correcting the first relationship by the control unit 11.

The control unit 11 acquires a replacement cause from the terminal 5 (S151).

The control unit 11 reads the use history DB 143, and acquires an SOH determined immediately before replacement (S152).

The control unit 11 refers to the SOH setting table and acquires an SOH corresponding to the replacement cause (S153).

The control unit 11 acquires the determination data at the time of determination from the use history DB 143, corrects the first relationship based on the determination data, the SOH corresponding to the determination data in the first relationship, and the SOH corresponding to the replacement cause, and stores the first relationship in the relationship DB 144 (S154).

When the use period is acquired as the replacement information, the first relationship is corrected in the same manner as described above.

The second relationship may be corrected in the same manner as described above.

Hereinafter, a method for estimating the life of the battery 3 will be described.

Figure 9:
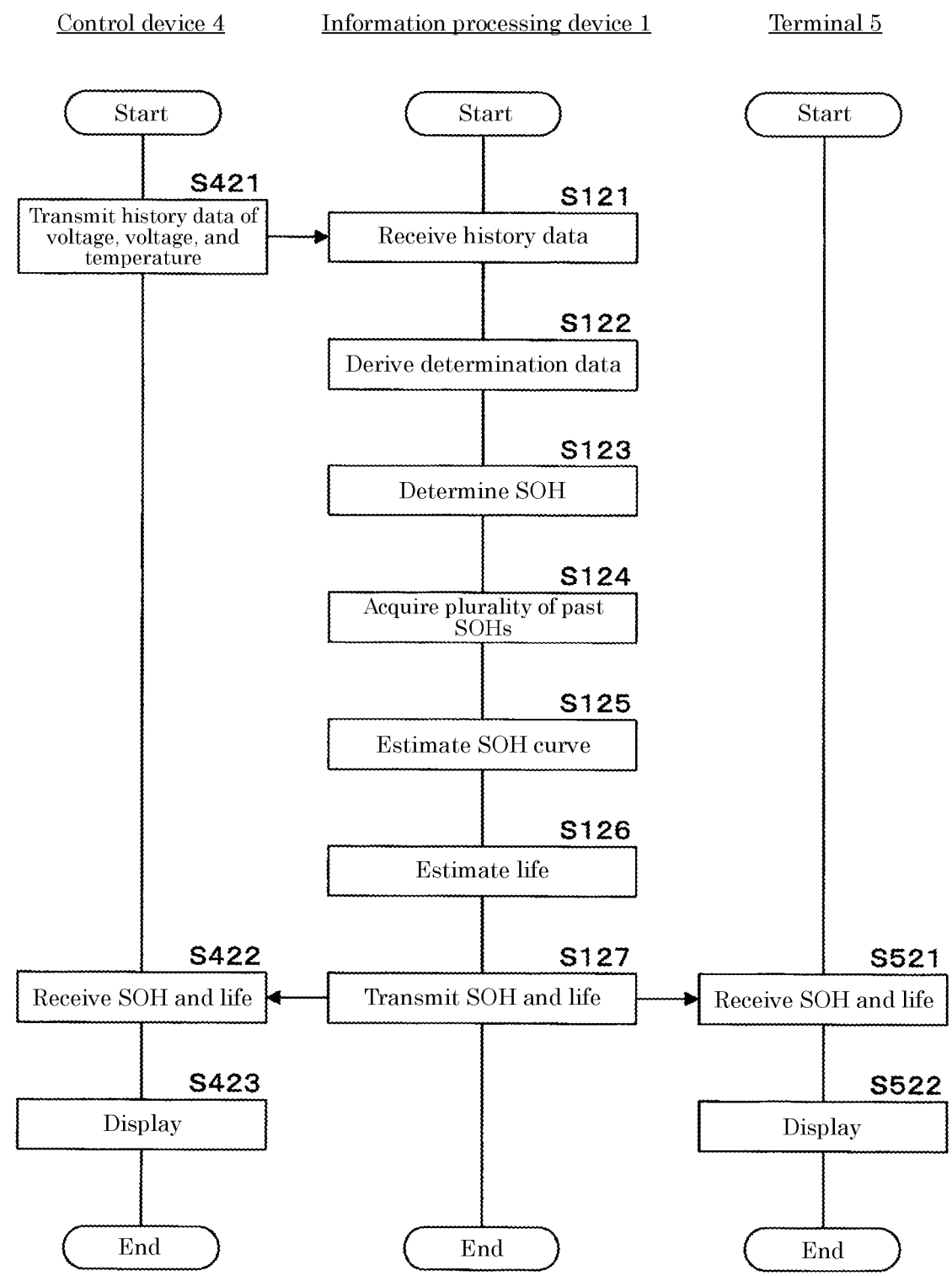
FIG. 9 is a flowchart illustrating a procedure of processing of estimating the life by the control unit.

FIG. 9 is a flowchart illustrating a procedure of processing of estimating the life by the control unit 11.

The control unit 41 transmits the history data of the current, the voltage, and the temperature (S421).

The control unit 11 receives the history data and stores the history data in the use history DB 143 (S121).

The control unit 11 derives determination data and stores the determination data in the use history DB 143 (S122).

The control unit 11 reads the first relationship from the relationship DB 144, determines the SOH based on the derived determination data and the first relationship, and stores the SOH in the use history DB 143 (S123).

The control unit 11 acquires a plurality of past SOHs for the same battery 3 from the use history DB 143 (S124).

The control unit 11 estimates transition of SOH in time series (SOH curve: relationship between time and SOH) and stores the SOH transition in the relationship DB 144 (S125). Based on the SOH determined this time and the plurality of SOHs determined in the past, the control unit 11 derives an SOH curve by using a method such as curve approximation by a least squares method or a Kalman filter. The past SOH curve may be stored in the relationship DB 144 based on the data of the deterioration history DB 142, and the SOH curve at the time of the current estimation may be derived with reference to the past SOH curve.

Figure 10:
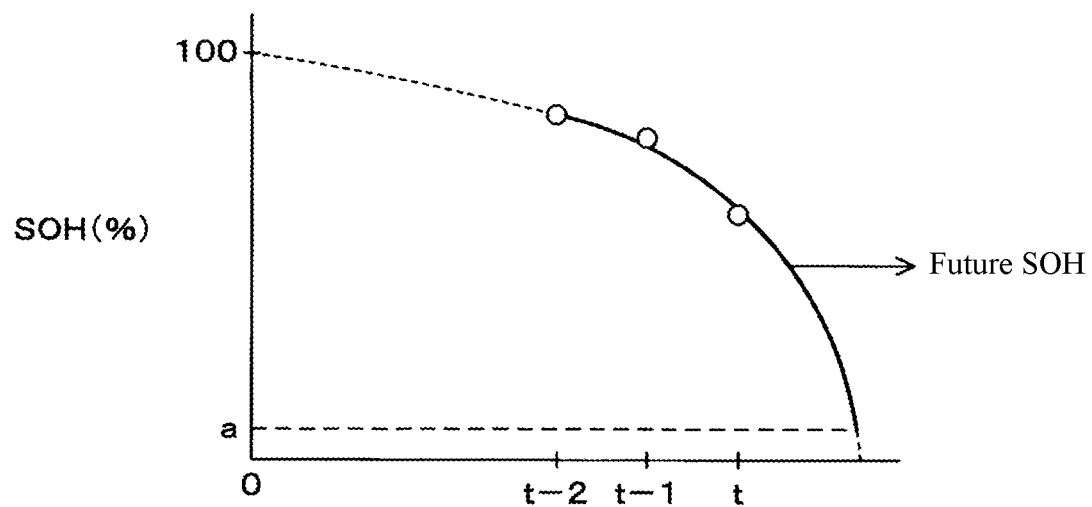
FIG. 10 is an explanatory diagram of a method for estimating a future SOH curve.

As illustrated in FIG. 10, the SOH determined at the determination time point t of this time, the determination time point t−1 of the previous time, and the determination time point t−2 of the second previous time are plotted to estimate a future SOH curve. The number of plots is not limited to the case of FIG. 10.

The control unit 11 estimates the life (S126). The control unit 11 acquires the time to when the SOH becomes a in the estimated SOH curve as the life (replacement time).

The control unit 11 transmits the SOH and the life to the control device 4 and the terminal 5 (S127).

The control unit 41 receives the SOH and the life (S422), and displays the SOH and the life on the display panel 46 (S423).

The control unit 51 receives the SOH and the life (S521), and displays the SOH and the life on the display panel 55 (S522).

Figure 11:
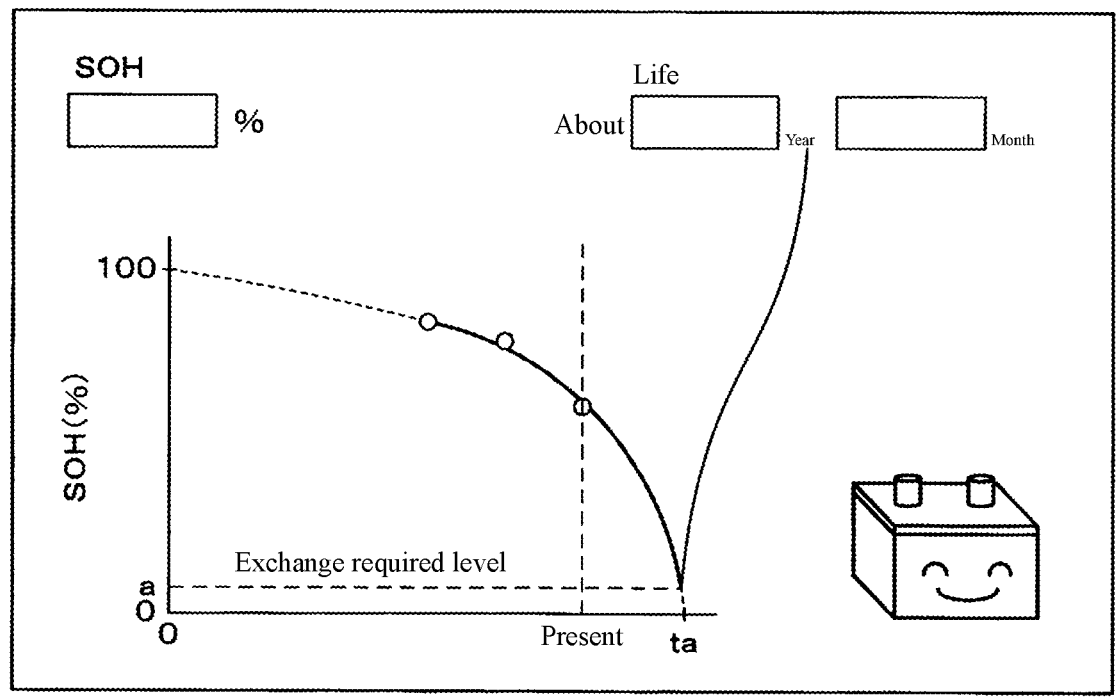
FIG. 11 is an explanatory diagram illustrating a display screen displayed on the display panel.

FIG. 11 is an explanatory diagram illustrating an example of a display screen displayed on the display panel 46 or the display panel 55.

The control unit 41 or 51 displays the SOH determined by the control unit 11 in the upper left part of the display screen. The control unit 41 or 51 displays an SOH curve in the lower left part of the display screen.

The control unit 41 or 51 displays the estimated life expiration date as the life in the upper right part of the display screen.

According to the present embodiment, the SOH of the battery 3 can be satisfactorily determined based on the determination data of the battery 3 to be determined with reference to the first relationship between the determination data and the SOH. The remaining life rate of the battery 3 can be satisfactorily estimated based on the determination data of the battery 3 to be determined with reference to the second relationship between the determination data and the remaining life rate. Alternatively, the remaining life rate of the battery 3 can be satisfactorily estimated based on the determined SOH of the battery 3 to be determined with reference to the third relationship between the SOH and the remaining life rate.

By estimating the SOH curve, it is possible to satisfactorily estimate the life, and it is also possible to extend the life by changing the use conditions.

Second Embodiment

Figure 12:
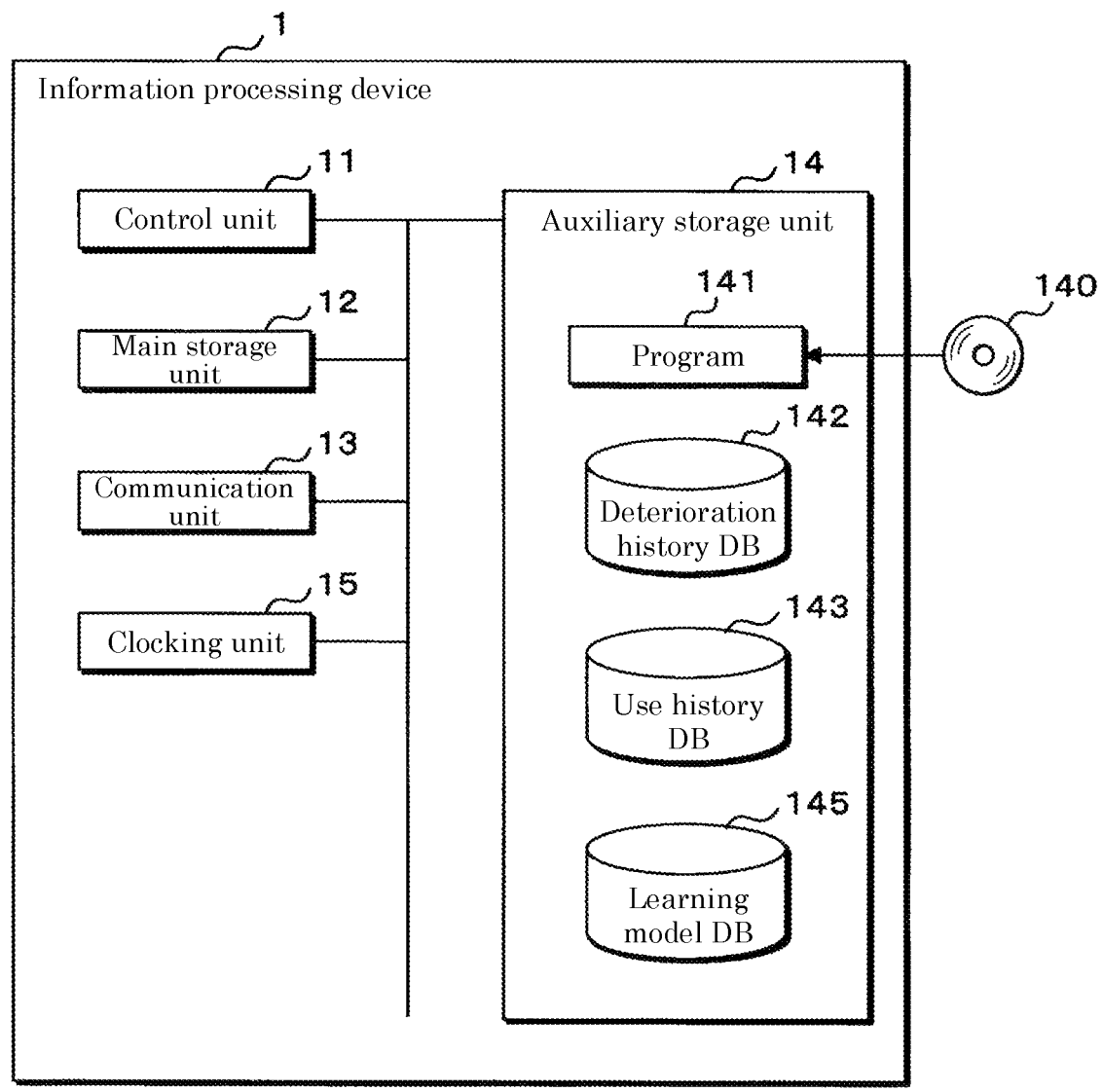
FIG. 12 is a block diagram illustrating a configuration of an information processing device of an information processing system according to a second embodiment.

FIG. 12 is a block diagram illustrating a configuration of an information processing device 1 of an information processing system according to a second embodiment.

The information processing system according to the second embodiment has the same configuration as the information processing system 10 according to the first embodiment except that the auxiliary storage unit 14 stores the learning model DB 145. The learning model DB 145 stores learning models 146 and 147.

Figure 13:
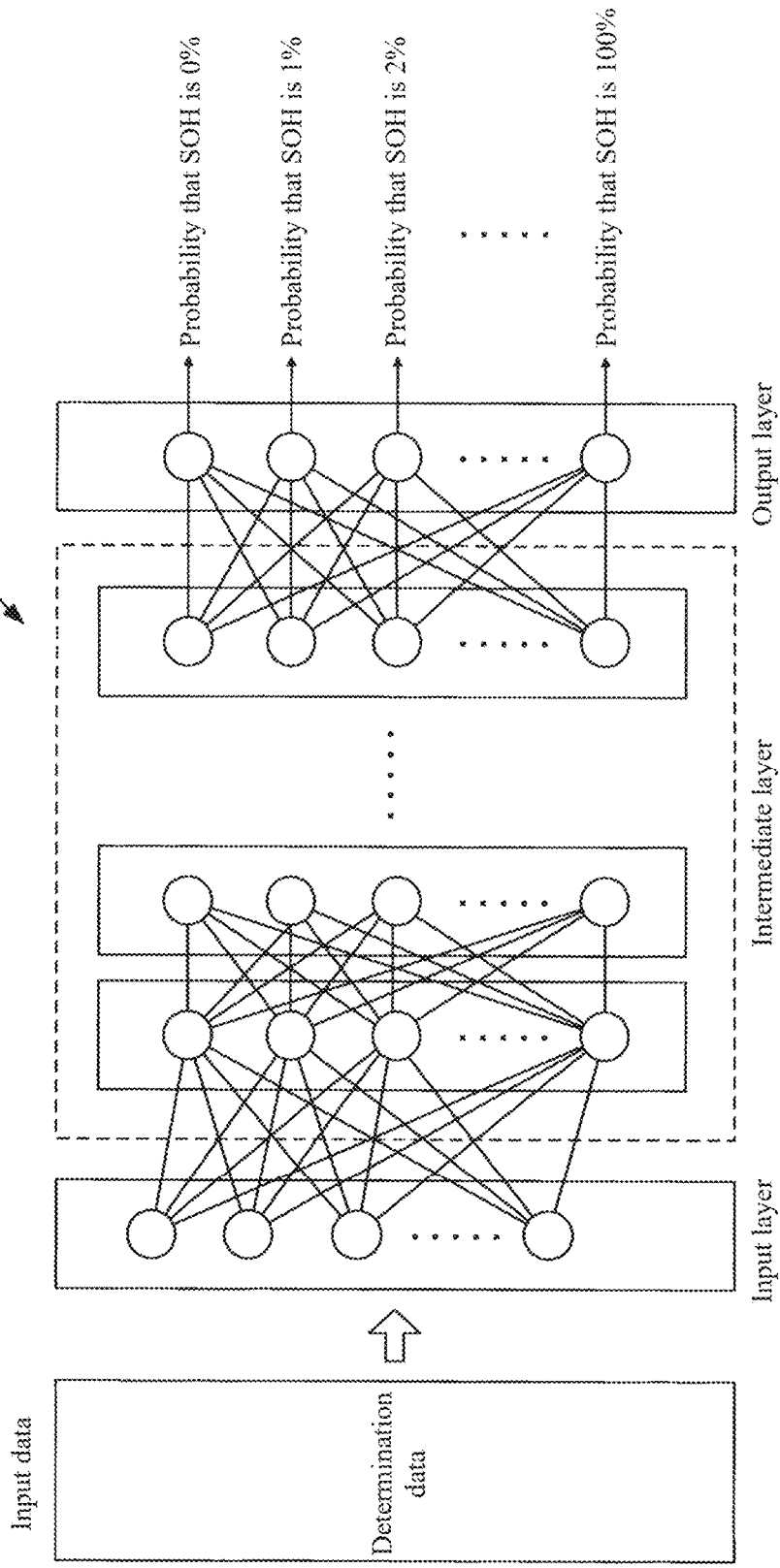
FIG. 13 is a schematic diagram illustrating an example of a learning model.

FIG. 13 is a schematic diagram illustrating an example of the learning model 146.

The learning model 146 is a learning model assumed to be used as a program module that is a part of artificial intelligence software, and a multilayer neural network (deep learning) can be used. For example, a convolutional neural network (CNN) can be used, but another neural network may be used. Other machine learning may be used. The control unit 11 operates to perform calculation on the determination data input to an input layer of the learning model 146 according to a command from the learning model 146, and output the SOH and the probability thereof as a determination result. The output layer outputs the SOH and the probability thereof in increments of 1% in a range of, for example, 0% to 100%. For a CNN, an intermediate layer includes a convolution layer, a pooling layer, and a fully connected layer. The number of nodes (neurons) is not limited to the case of FIG. 12.

One or a plurality of nodes exist in the input layer, the output layer, and the intermediate layer, and the nodes of each layer are combined with the nodes existing in the preceding and subsequent layers in one direction with a desired weight. A vector having the same number of components as the number of nodes of the input layer is given as input data of the learning model 146 (input data for learning and input data for determination). Examples of the determination data of the input data for determination include an integrated value of a current or a temperature, a time derivative value of a voltage, an internal resistance, or a combination thereof. The integrated value of the current or the temperature corresponds to history data of the current or the temperature.

The input layer of the learned learning model 146 inputs the determination data. When the data given to each node of the input layer is input and given to the first intermediate layer, the output of the intermediate layer is calculated using the weight and the activation function, the calculated value is given to the next intermediate layer, and the calculated value is successively transmitted to the subsequent layer (lower layer) similarly until the output of the output layer is obtained. Note that all of the weights combining the nodes are calculated by a learning algorithm.

The output layer of the learning model 146 generates an SOH and a probability thereof as output data.

The output layer outputs,
for example, the probability that the SOH is 0% 0.01,
the probability that the SOH is 1% 0.02,
the probability that the SOH is 2% 0.82, and
the probability that the SOH is 100% 0.001.

The control unit 11 acquires a numerical value of the SOH having the maximum probability.

The output layer is not limited to the case of outputting the SOH in increments of 1%. The SOH can be output at appropriate intervals, and the SOH may be represented by a class such as 10 stages.

Figure 14:
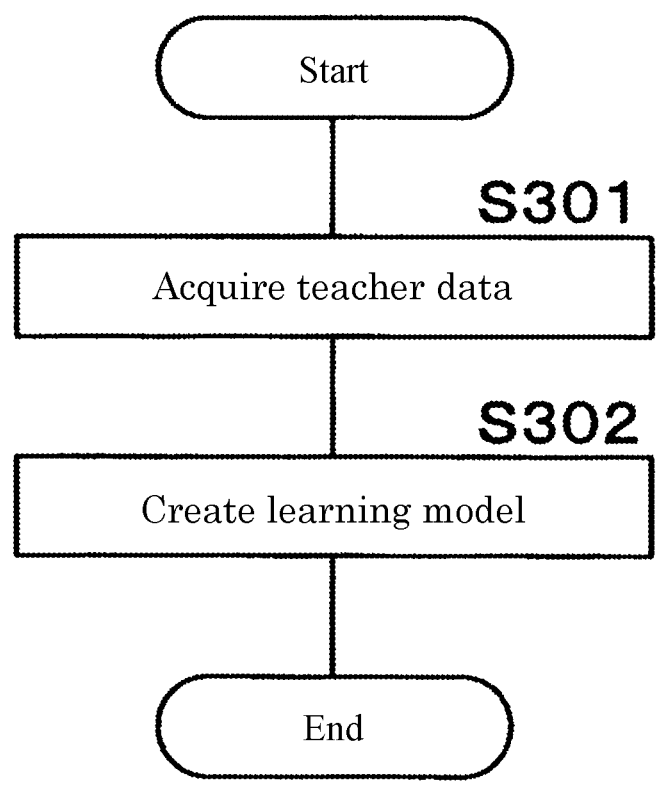
FIG. 14 is a flowchart illustrating a procedure of processing of generating the learning model by the control unit.

FIG. 14 is a flowchart illustrating a procedure of processing of generating the learning model 146 by the control unit 11.

The control unit 11 reads the deterioration history DB 142 and acquires teacher data in which determination data of each row is associated with an SOH based on the replacement information (S301).

The control unit 11 uses the teacher data to generate the learning model 146 (learned model) that outputs the SOH probability when the determination data is input (S302). Specifically, the control unit 11 inputs the teacher data to the input layer, performs calculation processing in the intermediate layer, and acquires the SOH probability from the output layer.

The control unit 11 compares the determination result of the SOH output from the output layer with information labeled with the determination date in the teacher data, that is, the correct value, and optimizes the parameter used for the calculation processing in the intermediate layer so that the output value from the output layer approaches the correct value. The parameter is, for example, the above-described weight (coupling coefficient), the coefficient of the activation function, or the like. The parameter optimization method is not particularly limited, but for example, the control unit 11 optimizes various parameters using an error back propagation method.

The control unit 11 stores the generated learning model 146 in the auxiliary storage unit 14, and ends the series of processing.

Figure 15:
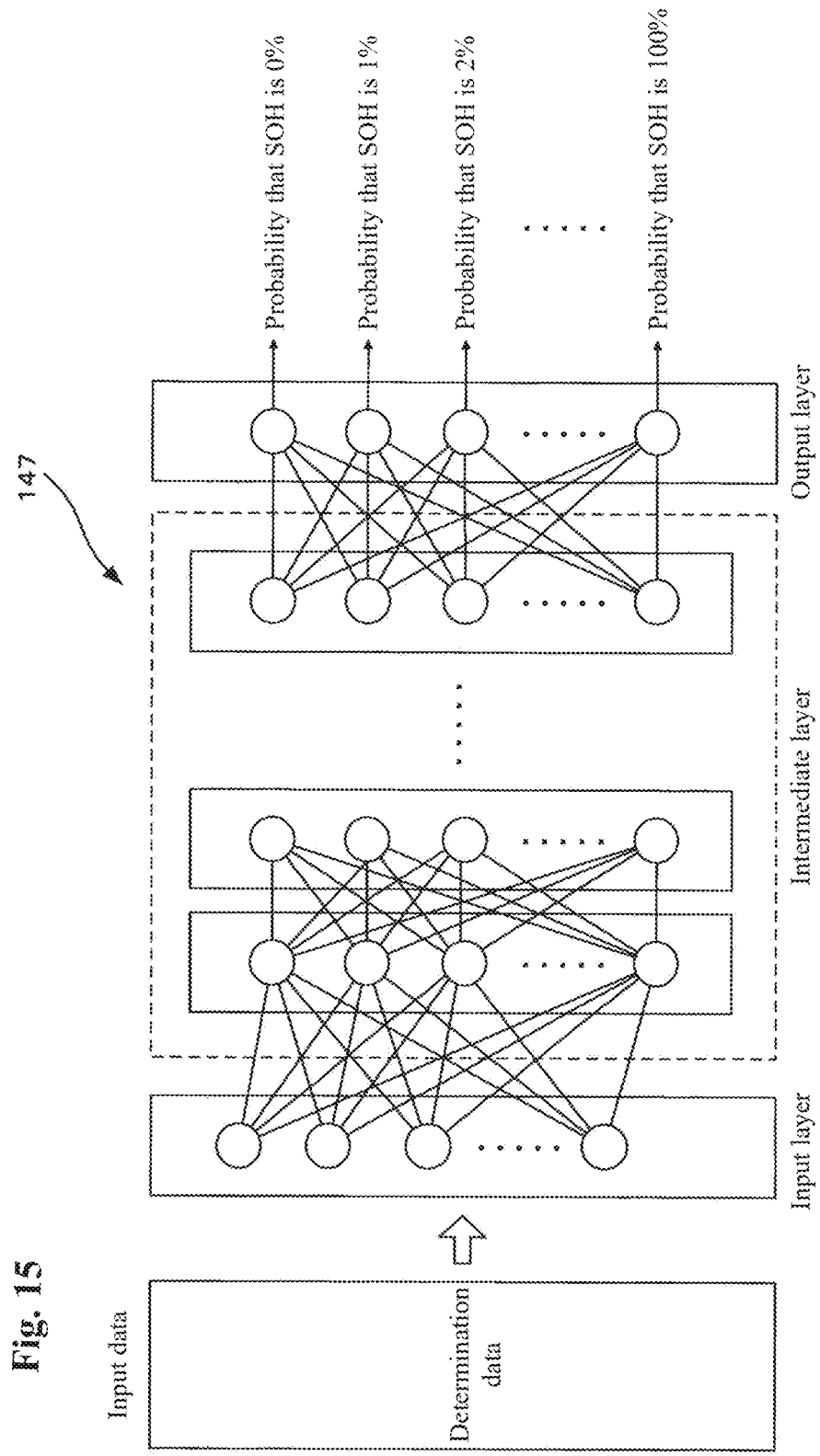
FIG. 15 is a schematic diagram illustrating an example of a learning model.

FIG. 15 is a schematic diagram illustrating an example of the learning model 147.

The learning model 147 is a learning model assumed to be used as a program module that is a part of artificial intelligence software, and a multilayer neural network (deep learning) can be used. For example, CNN can be used, but other machine learning may be used. The control unit 11 operates to perform calculation on the determination data input to an input layer of the learning model 147 according to a command from the learning model 147, and output the remaining life rate of the battery 3 and the probability thereof as an estimation result. For a CNN, an intermediate layer includes a convolution layer, a pooling layer, and a fully connected layer. The number of nodes (neurons) is not limited to the case of FIG. 15.

One or a plurality of nodes exist in the input layer, the output layer, and the intermediate layer, and the nodes of each layer are combined with the nodes existing in the preceding and subsequent layers in one direction with a desired weight. A vector having the same number of components as the number of nodes of the input layer is given as input data of the learning model 147 (input data for learning and input data for estimation). Examples of the determination data of the input data for estimation include an integrated value of a current or a temperature, a time derivative value of a voltage, an internal resistance, or a combination thereof. The integrated value of the current or the temperature corresponds to history data of the current or the temperature.

The input layer of the learned learning model 147 inputs the determination data. When the data given to each node of the input layer is input and given to the first intermediate layer, the output of the intermediate layer is calculated using the weight and the activation function, the calculated value is given to the next intermediate layer, and the calculated value is successively transmitted to the subsequent layer (lower layer) similarly until the output of the output layer is obtained. Note that all of the weights combining the nodes are calculated by a learning algorithm.

The output layer of the learning model 147 generates the probability of the remaining life rate as output data. The output layer outputs the remaining life rate and the probability thereof in increments of 1% in a range of, for example, 0% to 100%.

The output layer outputs,
for example, the probability that the remaining life rate is 0% 0.01,
the probability that the remaining life rate is 1% 0.02,
the probability that the remaining life rate is 2% 0.84, and
the probability that the remaining life rate is 100% 0.001.

The control unit 11 acquires a numerical value of the remaining life rate having the maximum probability.

The output layer is not limited to the case of outputting the remaining life rate in increments of 1%. The remaining life rate can be output at appropriate intervals, and the remaining life rate may be represented by a class such as 10 stages.

Figure 16:
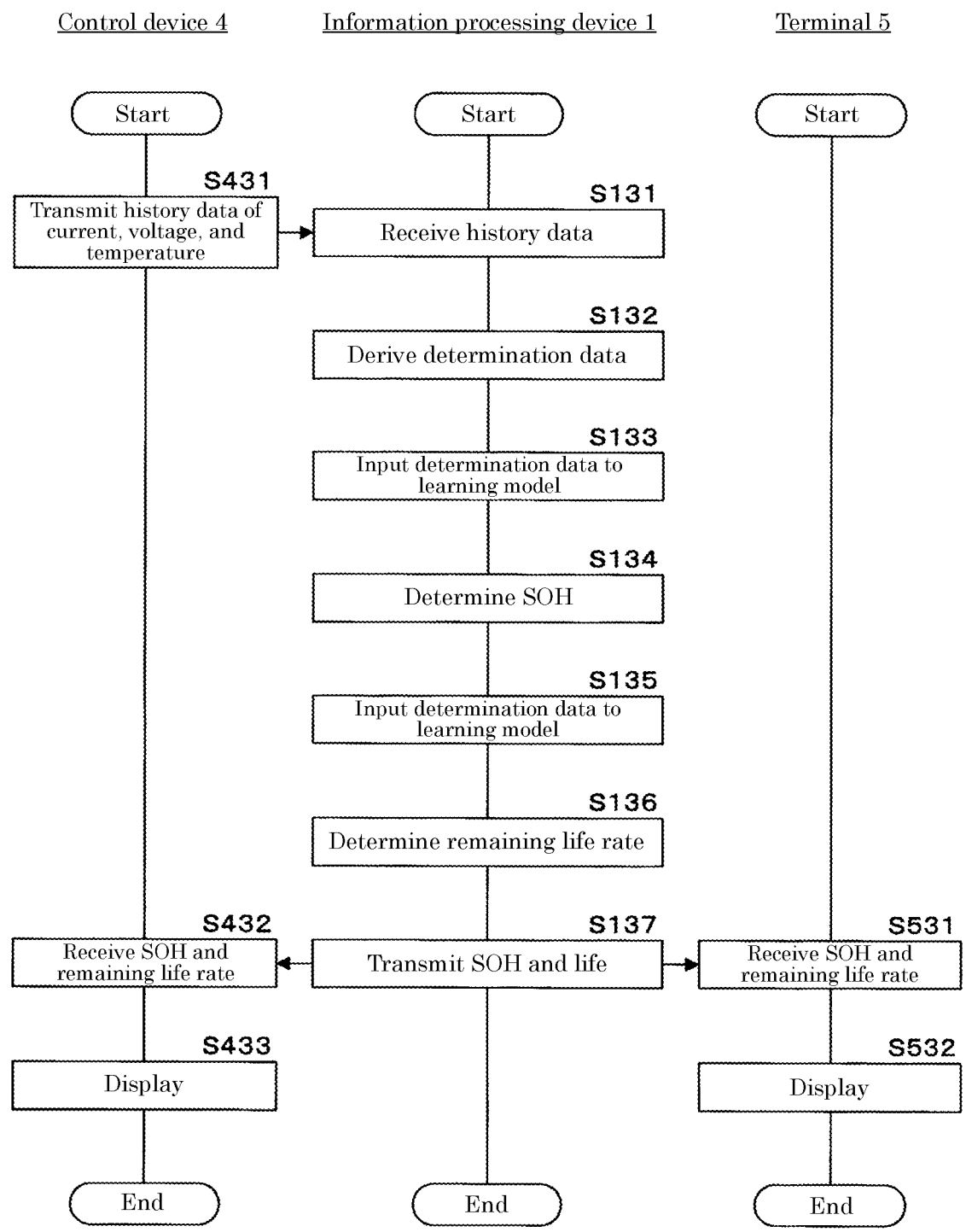
FIG. 16 is a flowchart illustrating a procedure of processing of determining the SOH and estimating the remaining life rate by the control unit.

FIG. 16 is a flowchart illustrating a procedure of processing of determining the SOH and estimating the remaining life rate by the control unit 11.

The control unit 41 transmits the history data of the current, the voltage, and the temperature to the information processing device 1 (S431).

The control unit 11 receives the history data and stores the history data in the use history DB 143 (S131).

The control unit 11 derives determination data and stores the determination data in the use history DB 143 (S132).

The control unit 11 inputs the determination data to the learning model 146 (S133).

The control unit 11 acquires the numerical value of the SOH having the maximum probability output from the learning model 146 as the SOH at the time of the current determination, and stores the acquired numerical value in the use history DB 143 (S134).

The control unit 11 inputs the determination data to the learning model 147 (S135).

The control unit 11 acquires the numerical value of the remaining life rate having the maximum probability output from the learning model 147 as the remaining life rate at the time of the current estimation, and stores the acquired numerical value in the use history DB 143 (S136).

The control unit 11 transmits the SOH and the remaining life to the information processing device 1 and the control device 4 (S137), and ends the processing.

The control unit 41 receives the SOH and the remaining life (S432), displays the SOH and the remaining life on the display panel 46 (S433), and ends the processing.

The control unit 51 receives the SOH and the remaining life (S531), displays the SOH and the remaining life on the display panel 55 (S532), and ends the processing.

Figure 17:
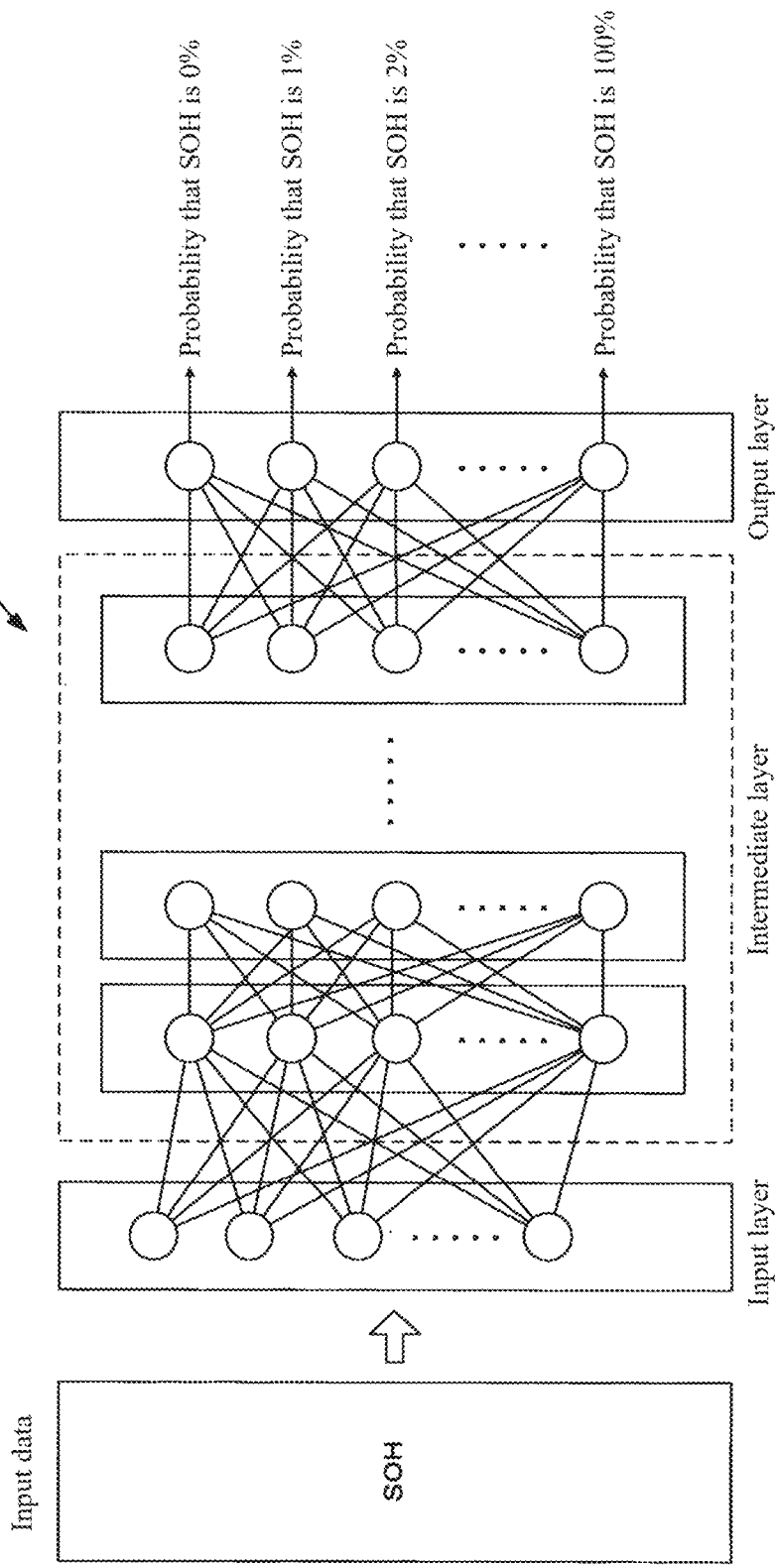
FIG. 17 is a schematic diagram illustrating an example of a learning model of a modification.

FIG. 17 is a schematic diagram illustrating an example of the learning model 148 of a modification.

In the learning model 148, the input layer inputs the SOH instead of the determination data of the learning model 147, and the output layer outputs the remaining life rate and the probability thereof.

After determining the SOH in S134 of the flowchart of FIG. 16, the control unit 11 inputs the determined SOH to the learning model 148 and acquires the remaining life rate.

In the present embodiment, the SOH and the remaining life rate can be easily and accurately acquired.

Third Embodiment

Figure 18:
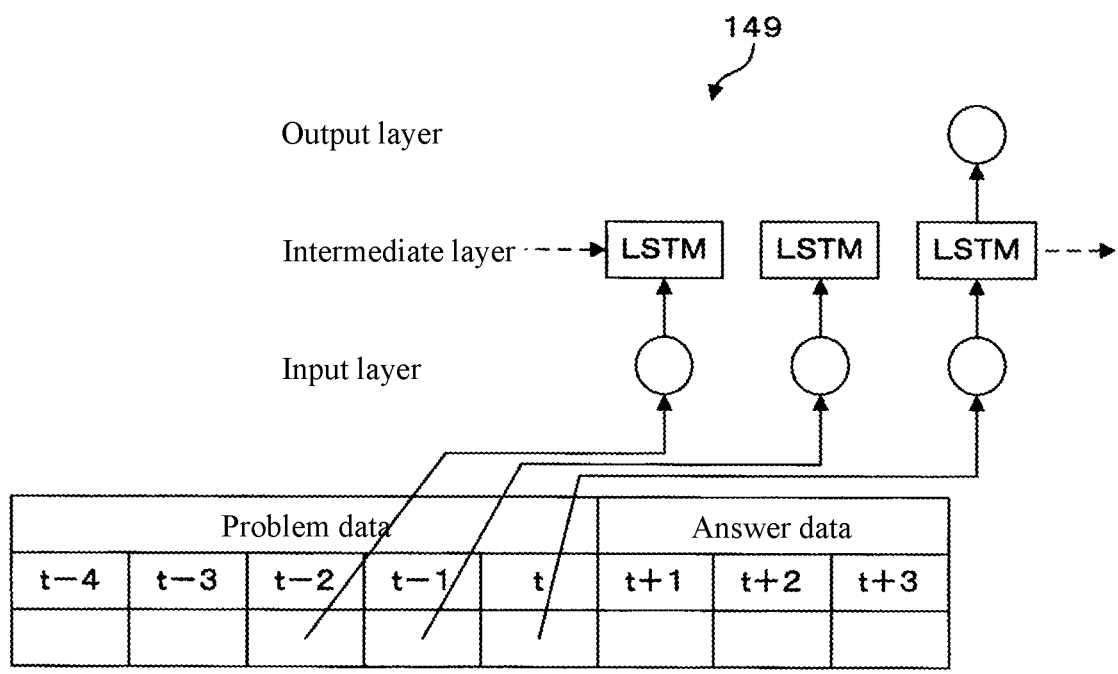
FIG. 18 is an explanatory diagram regarding generation processing of a learning model according to a third embodiment.

FIG. 18 is an explanatory diagram regarding generation processing of a learning model 149 according to a third embodiment. The control unit 11 constructs (generates) a neural network having a plurality of SOHs in time series as inputs and SOHs at a plurality of future time points as outputs by learning based on teacher data having a plurality of SOHs in time series as problem data and SOHs at a plurality of future time points as answer data. The SOH can be determined based on expected characteristics of the lead-acid battery 3. Examples of the SOH include "Ratio of Voltage during Normal Temperature High Rate Discharge at time of Estimation to Voltage during Normal Temperature High Rate Discharge at Reference Time" and a capacity retention ratio. When the remaining life rate is set to an SOH, the remaining life rate is output in time series from the output layer.

The plurality of SOHs in time series means a plurality of SOHs in time series from the past to the time of current estimation in the same battery 3. The SOHs at a plurality of future time points means SOHs at a plurality of future time points such as the second point with respect to the time of current estimation and the third point after the second point.

The input layer has a single or a plurality of neurons that receives a plurality of SOHs in time series, and passes each input SOH to the intermediate layer. The intermediate layer includes an autoregressive layer including a plurality of neurons. The autoregressive layer is implemented as, for example, a long short term memory (LSTM) model, and a neural network including such an autoregressive layer is referred to as a recurrent neural network (RNN). The intermediate layer outputs a change amount due to each of the plurality of SOHs sequentially input along the time series. The output layer has one or a plurality of neurons for SOHs at a plurality of future time points, and outputs the SOHs at the plurality of future time points based on the change amount by each of the plurality of SOHs output from the intermediate layer. Learning for such RNN is performed using, for example, a backpropagation through time (BPTT) algorithm.

The teacher data may be stored in a sequence form. In a case where the teacher data is in a sequence form, for example, the values of the elements from 0 to 4 (t−4 to t) of the SEQ ID NO may be used as problem data, and the values of the elements from 5 to 7 (t+1 to t+3) of the SEQ ID NO may be used as answer data. The time-series problem data (t−2, t−1, t) input from the input layer is sequentially transferred to the LSTM (autoregressive layer), and the LSTM (autoregressive layer) outputs the output value to the output layer and its own layer, thereby being able to process series information including the temporal change and the order.

Figure 19:
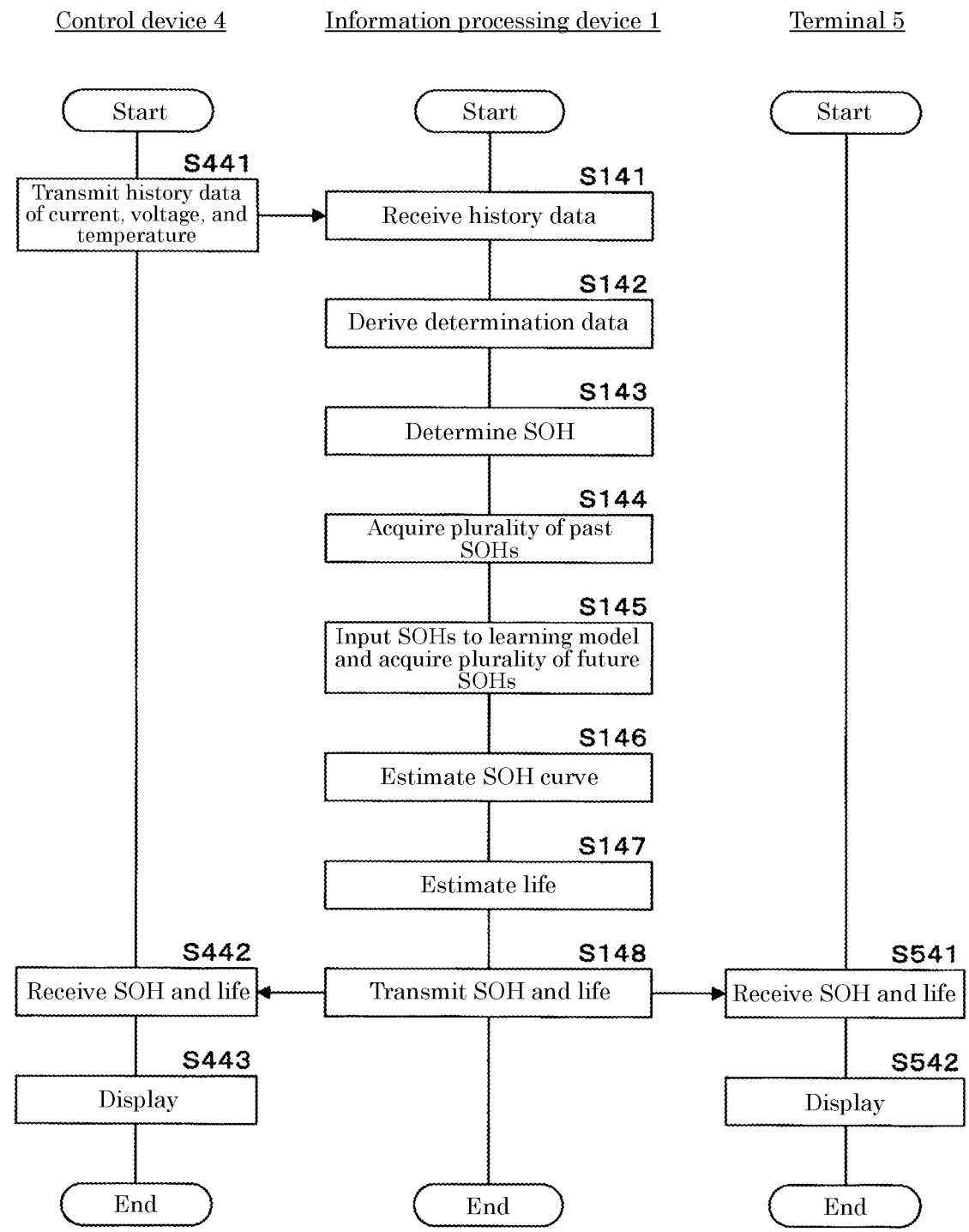
FIG. 19 is a flowchart illustrating a procedure of processing of estimating the life by the control unit.

FIG. 19 is a flowchart illustrating a procedure of processing of estimating the life by the control unit 11.

The control unit 41 transmits the history data of the current, the voltage, and the temperature to the information processing device 1 (S441).

The control unit 11 receives the history data and stores the history data in the use history DB 143 (S141).

The control unit 11 derives determination data and stores the determination data in the use history DB 143 (S142).

The control unit 11 determines the SOH and stores the SOH in the use history DB 143 (S143). The control unit 11 determines the SOH based on the derived determination data and the first relationship. Alternatively, the determination data is input to the learning model 146, and the numerical value of the SOH having the maximum probability output by the learning model 146 is acquired as the SOH at the time of the current determination.

The control unit 11 acquires a plurality of SOHs (S144).

The control unit 11 inputs a plurality of SOHs in time series to the learned learning model 149 and acquires a plurality of future SOHs (S145).

The control unit 11 estimates the transition (SOH curve) of the SOH in time series based on the plurality of SOHs in the past, the present, and the future as described above, and stores the transition in the relationship DB 144 (S146).

The control unit 11 estimates the life (S147). The control unit 11 acquires the time to when the SOH reaches the threshold a as the life (replacement time).

The control unit 11 transmits the SOH and the life to the information processing device 1 and the control device 4 (S148), and ends the processing.

The control unit 41 receives the SOH and the life (S442), displays the SOH and the life on the display panel 46 (S443), and ends the processing.

The control unit 51 receives the SOH and the life (S541), displays the SOH and the life on the display panel 55 (S542), and ends the processing.

In the present embodiment, it is possible to accurately acquire a plurality of future SOHs and predict the life.

The present invention is not limited to the contents of the above-described embodiments, and various modifications can be made within the scope indicated in the claims. That is, embodiments obtained by combining technical means appropriately changed within the scope indicated in the claims are also included in the technical scope of the present invention.

In each of the above-described embodiments, a lead-acid battery mounted on a vehicle has been described as an example, but the present invention is not limited thereto. In the present invention, the power storage device to be subjected to the determination of the degree of deterioration or the estimation of the remaining life may be any power storage device mounted on a vehicle, and may be a power storage device such as a lithium ion secondary battery, a nickel hydrogen battery, or a capacitor.

DESCRIPTION OF REFERENCE SIGNS

1: information processing device
2: vehicle
3: lead-acid battery (battery)
4: control device
5: terminal
11: control unit (first acquisition unit, second acquisition unit, setting unit, determination unit, second setting unit, estimation unit)
12, 52: main storage unit
13, 53: communication unit
54: operation unit
14, 56: auxiliary storage unit
140: recording medium
141: program
142: deterioration history DB
143: use history DB
144: relationship DB
145: learning model DB
146, 147, 148, 149: learning model

The invention claimed is:

1. An information processing device comprising:
a first acquisition unit that acquires history data of at least one of a current, a voltage, or a temperature of a power storage device mounted on a vehicle;
a second acquisition unit that acquires at least one of a use period until replacement of the power storage device or a cause of replacement;
a deriving unit that derives determination data based on the history data acquired by the first acquisition unit;
a setting unit that sets a degree of deterioration at a time of replacement of the power storage device based on at least one of the use period or the cause of replacement acquired by the second acquisition unit; and
a determination unit that determines a degree of deterioration of the power storage device to be determined at the time of determination based on a relationship between determination data and a degree of deterioration obtained by a plurality of other power storage devices in advance, and the determination data of the power storage device to be determined, which is derived by the deriving unit.

2. The information processing device according to claim 1, wherein the determination unit inputs the determination data of the power storage device to be determined, which is derived by the deriving unit, to a learning model that outputs a degree of deterioration when the determination data is input, and determines a degree of deterioration.

3. The information processing device according to claim 1,
wherein the second acquisition unit further acquires an actually measured degree of deterioration of the power storage device at the time of replacement, and
wherein the setting unit corrects the degree of deterioration on a basis of the actually measured degree of deterioration acquired by the second acquisition unit.

4. The information processing device according to claim 1, further comprising:
a second setting unit that sets a remaining life of the power storage device based on at least one of the use period acquired by the second acquisition unit or the cause of replacement; and
an estimation unit that estimates a remaining life based on a relationship between a degree of deterioration and the remaining life, and the degree of deterioration of the power storage device to be determined, which is determined by the determination unit.

5. The information processing device according to claim 4, wherein the estimation unit inputs the degree of deterioration of the power storage device determined by the determination unit to a second learning model that outputs a remaining life when a degree of deterioration is input, and estimates the remaining life.

6. The information processing device according to claim 4, wherein the remaining life represents a transition of a degree of deterioration after a time point at which determination data is derived.

7. The information processing device according to claim 1, wherein the setting unit sets the degree of deterioration or the remaining life according to whether the cause of replacement is a trouble of the power storage device or a cause before occurrence of the trouble.

8. The information processing device according to claim 1, further comprising:
a third acquisition unit that acquires the degree of deterioration determined by the determination unit immediately before replacement when the second acquisition unit acquires at least one of the use period or the cause of replacement;
a fourth acquisition unit that acquires the degree of deterioration set by the setting unit based on at least one of the use period or the cause of replacement; and
a correction unit that corrects the relationship between the determination data and the degree of deterioration based on the determination data at the time of determination by the determination unit and the degree of deterioration acquired by the fourth acquisition unit.

9. An information processing device comprising:
a first acquisition unit that acquires history data of at least one of a current, a voltage, or a temperature of a power storage device mounted on a vehicle;
a second acquisition unit that acquires at least one of a use period until replacement of the power storage device or a cause of replacement;

a deriving unit that derives determination data based on the history data acquired by the first acquisition unit;

a setting unit that sets a remaining life of the power storage device based on at least one of the use period or the cause of replacement acquired by the second acquisition unit; and an estimation unit that estimates a remaining life of the power storage device based on a relationship between determination data and a remaining life obtained by a plurality of other power storage devices in advance, and the determination data of the power storage device to be determined, which is derived by the deriving unit.

10. The information processing device according to claim 9, wherein the estimation unit inputs the determination data of the power storage device to be determined, which is derived by the deriving unit, to a learning model that outputs a remaining life when determination data is input, and estimates a remaining life.

11. The information processing device according to claim 9, further comprising:

a third acquisition unit that acquires the remaining life estimated by the estimation unit immediately before replacement when the second acquisition unit acquires at least one of the use period or the cause of replacement;

a fourth acquisition unit that acquires the remaining life set by the setting unit based on at least one of the use period or the cause of replacement; and a correction unit that corrects the relationship between the determination data and the remaining life based on the determination data at the time of estimation by the estimation unit and the remaining life acquired by the fourth acquisition unit.

12. An information processing method comprising:

acquiring history data of at least one of a current, a voltage, or a temperature of a power storage device mounted on a vehicle;

acquiring at least one of a use period until replacement of the power storage device or a cause of replacement;

deriving determination data based on the acquired history data;

setting a degree of deterioration of the power storage device based on at least one of the acquired use period or cause of replacement; and determining a degree of deterioration of the power storage device based on a relationship between determination data and a degree of deterioration obtained by a plurality of other power storage devices in advance, and the determination data of the power storage device to be determined.

13. The information processing method according to claim 12, further comprising:

acquiring a degree of deterioration determined immediately before replacement when at least one of the use period or the cause of replacement is acquired;

acquiring a degree of deterioration to be set based on at least one of the use period or the cause of replacement; and correcting the relationship between the determination data and the degree of deterioration based on the determination data at the time of determination and the degree of deterioration to be set.

* * * * *